(12) United States Patent
Aihara et al.

(10) Patent No.: US 10,493,672 B2
(45) Date of Patent: Dec. 3, 2019

(54) IMPRINT APPARATUS, METHOD OF MANUFACTURING ARTICLE, INFORMATION PROCESSING APPARATUS, METHOD OF SUPPORTING MAP EDITING, AND STORAGE MEDIUM

(71) Applicant: CANON KABUSHIKI KAISHA, Tokyo (JP)

(72) Inventors: Sentaro Aihara, Utsunomiya (JP); Yeshwanth Srinivasan, Austin, TX (US); Steven Wayne Burns, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 15/632,692

(22) Filed: Jun. 26, 2017

(65) Prior Publication Data

US 2018/0370091 A1    Dec. 27, 2018

(51) Int. Cl.
    *B29C 43/56*     (2006.01)
    *G03F 7/00*      (2006.01)
    *B05C 9/02*      (2006.01)
    *H01L 21/027*    (2006.01)
    *G03F 9/00*      (2006.01)

(52) U.S. Cl.
    CPC .............. *B29C 43/56* (2013.01); *B05C 9/02* (2013.01); *G03F 7/0002* (2013.01); *G03F 9/7038* (2013.01); *G03F 9/7088* (2013.01); *H01L 21/027* (2013.01)

(58) Field of Classification Search
    CPC ......... B29C 43/56; B05C 9/02; G03F 7/0002; G03F 9/7038; G03F 9/7088; H01L 21/027
    See application file for complete search history.

(56) References Cited

U.S. PATENT DOCUMENTS

| | | | |
|---|---|---|---|
| 6,165,658 A * | 12/2000 | Taff ....................... | G03F 7/2051 430/30 |
| 7,941,234 B2 | 5/2011 | Aihara | |
| 8,349,241 B2 | 1/2013 | Sreenivasan et al. | |
| 8,769,471 B2 * | 7/2014 | Noy .................... | G06F 17/5068 716/137 |
| 2004/0065976 A1 | 4/2004 | Sreenivasan et al. | |
| 2015/0352756 A1 * | 12/2015 | Yamaguchi ........... | G03F 7/0002 264/40.4 |
| 2017/0015045 A1 * | 1/2017 | Yamaguchi .............. | B41J 3/407 |
| 2019/0121231 A1 * | 4/2019 | Traub .................... | G03F 7/0002 |

\* cited by examiner

*Primary Examiner* — David H Banh
(74) *Attorney, Agent, or Firm* — Venable LLP

(57) ABSTRACT

The present invention provides an imprint apparatus which forms a pattern of an imprint material onto a substrate by using a mold, the apparatus including a control unit configured to provide a user interface for displaying a first map indicating a supply position of the imprint material to be supplied onto the substrate, an adjustment window for adjusting a value of an apparatus parameter which is set in the imprint apparatus and used to change a supply position of the imprint material, and a second map indicating a supply position of the imprint material after adjustment of the value of the apparatus parameter.

18 Claims, 17 Drawing Sheets

IMPRINT APPARATUS, METHOD OF MANUFACTURING ARTICLE, INFORMATION PROCESSING APPARATUS, METHOD OF SUPPORTING MAP EDITING, AND STORAGE MEDIUM

BACKGROUND OF THE INVENTION

Field of the Invention

The present invention relates to an imprint apparatus, a method of manufacturing an article, an information processing apparatus, a method of supporting map editing, and a storage medium.

Description of the Related Art

An imprint technique is a technique of transferring a pattern formed on a mold (die) onto an imprint material supplied (applied) onto a substrate. This technique has been proposed as one of the lithography techniques of manufacturing semiconductor devices and magnetic storage media. An imprint apparatus using the imprint technique cures an imprint material on a substrate while the imprint material is in contact with a mold, and transfers a pattern of the mold onto the imprint material on the substrate by releasing the mold from the cured imprint material.

In the imprint apparatus, because the amount (required amount) of imprint material to be supplied onto a substrate and the manner of how the imprint material spreads vary depending on the shape of a pattern of a mold, it is necessary to supply the imprint material onto the substrate in a state suitable for the pattern of the mold. Under the circumstance, there has been proposed a technique of supplying a droplet imprint material to discrete positions on a substrate. An imprint apparatus using such a technique designates whether to supply an imprint material to each lattice position defined on a substrate. That is, this apparatus uses a map (application pattern) indicating the imprint material supply positions on a substrate. In addition, U.S. Patent Application Publication No. 2004/0065976 has proposed, as a technique associated with such a map, a method of generating a map based on pattern density information concerning each local region of a mold.

On the other hand, the imprint apparatus uses apparatus parameters, in addition to the above map, to control (change) the imprint material supply positions on a substrate. Assume that it is desired to supply an imprint material at intervals smaller than the imprint material supply intervals designated by a map (that is, positions between such supply intervals). In this case, the apparatus can supply an imprint material to positions different from the supply positions designated by the map by changing apparatus parameters as well as supplying the imprint material in accordance with the map. In this manner, when supplying an imprint material onto a substrate, the apparatus finely adjusts the imprint material supply positions using apparatus parameters based on a map.

In the imprint apparatus, when supplying an imprint material in accordance with a map, the user can easily grasp the positions of the imprint material (array pattern) supplied onto a substrate by referring to a map allowing easy checking. When, however, changing apparatus parameters with respect to a map (that is, finely adjusting the imprint material supply positions on a substrate), the user finds it difficult to grasp the positions of the imprint material supplied onto the substrate.

SUMMARY OF THE INVENTION

The present invention provides an imprint apparatus which is advantageous in terms of grasping the imprint material supply positions on a substrate.

According to one aspect of the present invention, there is provided an imprint apparatus which forms a pattern of an imprint material onto a substrate by using a mold, the apparatus comprising a control unit configured to provide a user interface for displaying a first map indicating a supply position of the imprint material to be supplied onto the substrate, an adjustment window for adjusting a value of an apparatus parameter which is set in the imprint apparatus and used to change a supply position of the imprint material, and a second map indicating a supply position of the imprint material after adjustment of the value of the apparatus parameter.

Further aspects of the present invention will become apparent from the following description of exemplary embodiments with reference to the attached drawings.

DESCRIPTION OF THE EMBODIMENTS

Figure 1:
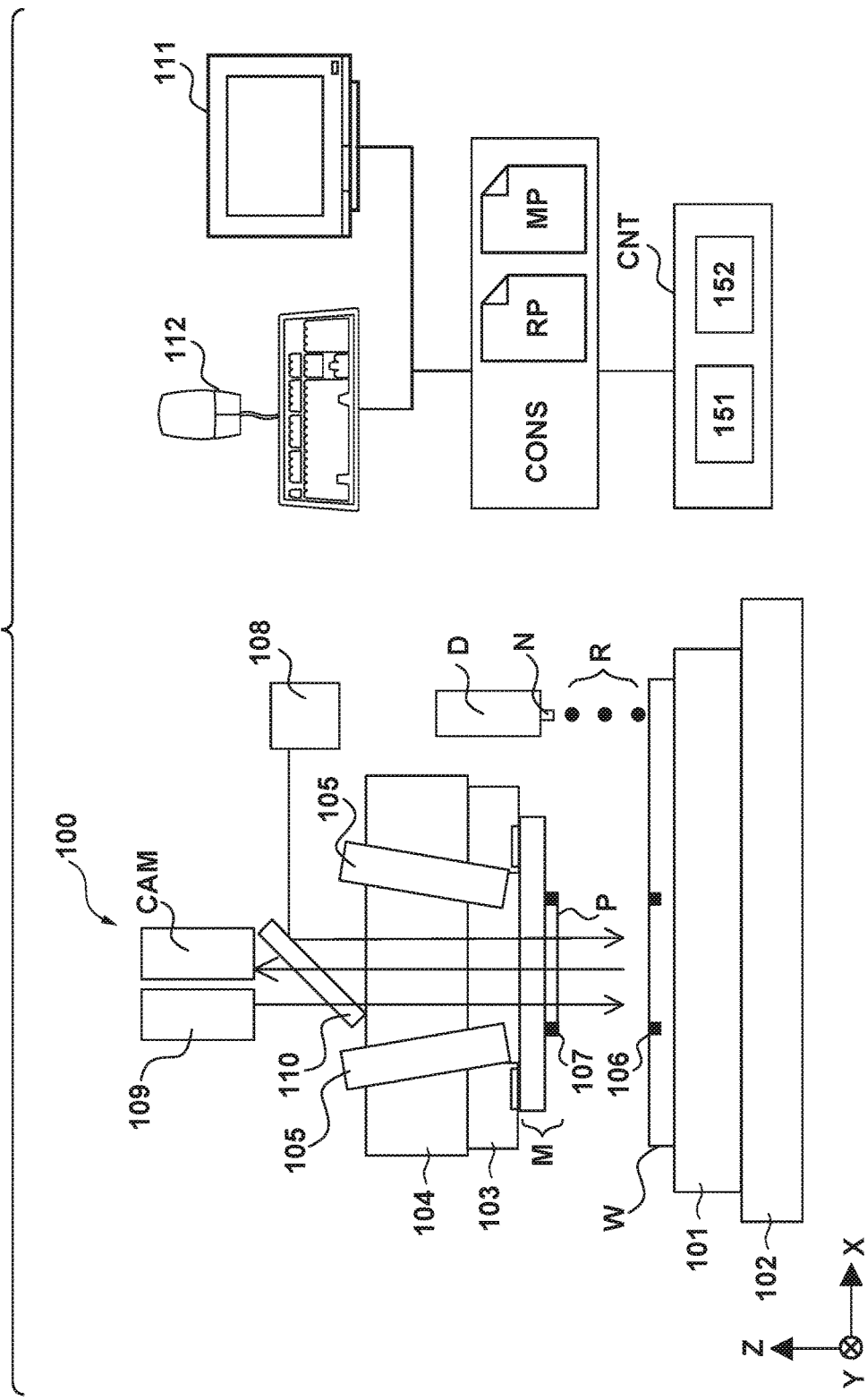
FIG. 1 is a schematic view showing the arrangement of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 100 according to an aspect of the present invention. The imprint apparatus 100 is a lithography apparatus which forms a pattern of an imprint material on a substrate by using a mold. The imprint apparatus 100 applies curing energy to an imprint material supplied onto a substrate while the imprint material is in contact with a mold, thereby forming a pattern of the cured material onto which a concave-convex pattern of the mold has been transferred.

An imprint material to be used includes a curable composition (also sometimes called an uncured resin) which is cured upon application of curing energy. Curing energy to be used includes an electromagnetic wave and heat. An electromagnetic wave to be used includes, for example, light such as infrared light, visible light, or ultraviolet light selected from the wavelength range of 10 nm or more to 1 mm or less.

A curable composition is a composition which is cured upon irradiation with light or application of heat. A curable composition which is cured upon irradiation with light contains at least a polymerizable compound and a photopolymerization initiator, and may contain a nonpolymerizable compound or solvent as needed. A nonpolymerizable compound is at least one type of compound selected from the group consisting of a sensitizer, a hydrogen donor, an internal mold release agent, a surfactant, an antioxidant, and a polymer component.

An imprint material may be supplied in a film form onto a substrate by a spin coater or slit coater. Alternatively, an imprint material may be supplied in a droplet form, an island form or film form with droplets being chained together, onto a substrate. The viscosity (at 25° C.) of the imprint material is 1 mPa·s or more to 100 mPa·s or less.

A substrate to be used is made of glass, ceramic, a metal, a semiconductor, and a resin. A member formed from a material different from a substrate may be formed on its surface, as needed. More specifically, a substrate to be used includes a silicon wafer, a compound semiconductor wafer, and a silica glass wafer.

The imprint apparatus 100 includes a substrate chuck 101 which holds a substrate W and a substrate stage 102 which holds and moves the substrate chuck 101. The imprint apparatus 100 includes a mold chuck 103 which holds a mold M on which a pattern P is formed and a mold stage 104 which holds and moves the mold chuck 103. The imprint apparatus 100 includes a supply unit D which supplies an imprint material R onto a substrate and a control unit CNT which is formed from an information processing apparatus (computer) including a CPU 151 and a memory 152, and controls each unit (operation) of the imprint apparatus 100. The imprint apparatus 100 includes a console unit CONS which manages an editing screen (operation screen) functioning as a user interface, a monitor (display unit) 111 which displays the editing screen, and an input device 112 including a keyboard and a mouse. This embodiment will exemplify a case in which an ultraviolet curable imprint material which is cured upon irradiation with ultraviolet light is used as the imprint material R. The imprint material R may be a thermoplastic imprint material or thermosetting imprint material.

Figure 2:
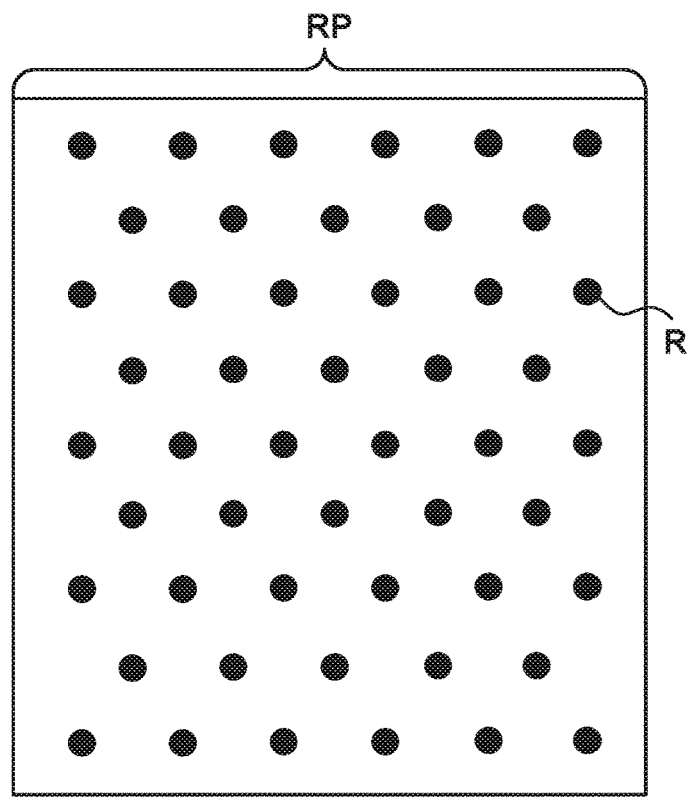
FIG. 2 is a view showing an example of a map indicating the supply positions of an imprint material to be supplied onto a substrate.
Figure 3:
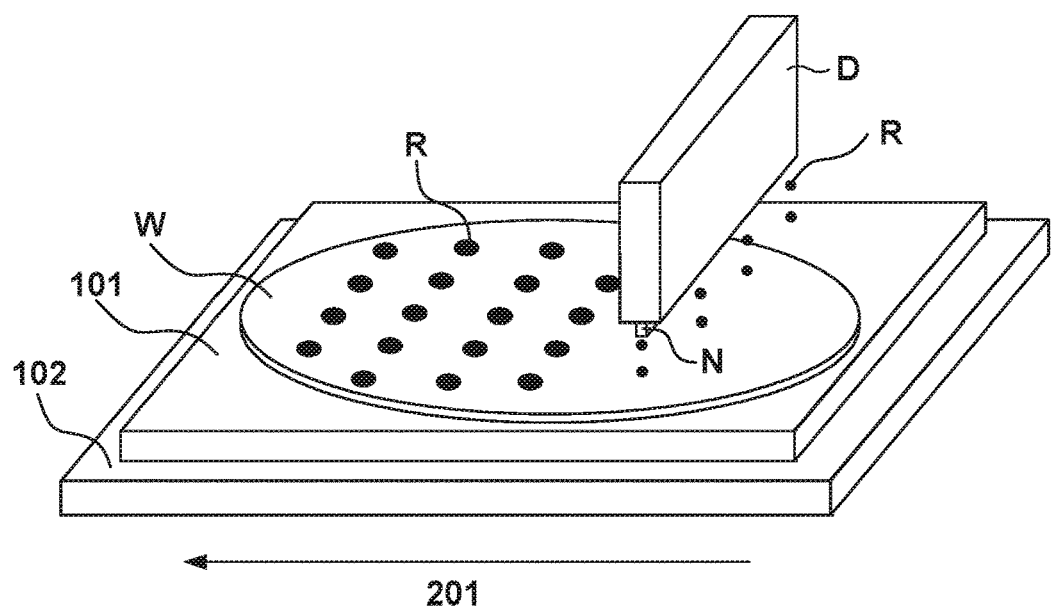
FIG. 3 is a perspective view for explaining the supply of an imprint material onto a substrate.

FIG. 2 is a view showing an example of a map RP managed by the console unit CONS. The map RP indicates coordinates at the time of supply of the imprint material R onto a substrate, that is, the supply positions of the imprint material R to be supplied onto the substrate, and is stored in the console unit CONS which also functions as a storage unit in this embodiment. The control unit CNT controls the substrate stage 102 and the supply unit D so as to supply the imprint material R to the supply positions on the substrate which are indicated in the map RP. More specifically, as shown in FIG. 3, the control unit CNT jets the imprint material R from a plurality of nozzles N constituting the supply unit D while moving the substrate stage 102 in the direction indicated by an arrow 201. This operation forms, on the substrate, an array pattern of the imprint material R which corresponds to the map RP.

Bringing (impressing) the mold M into contact with the imprint material R supplied onto the substrate will fill the pattern P of the mold M with the imprint material R on the substrate. A concave portion having an area larger than that of the pattern P of the mold M is formed in the surface of the mold chuck 103 opposite to the mold holding surface. This concave portion is sealed with the mold M and seal glass (not shown) to form a sealed space (cavity portion). A pressure adjusting unit (not shown) for adjusting the pressure in the cavity portion is connected to the cavity portion. When the imprint material R on the substrate is brought into contact with the mold M, the pressure in the cavity portion is increased to deform the mold M in a concave shape with respect to the substrate W, thereby inhibiting air bubbles from being caught between the substrate W and the mold M. When the imprint material R on the substrate comes into contact with the mold M, the pressure in the cavity portion is restored to completely bring the imprint material R on the substrate into contact with the mold M.

The imprint apparatus 100 includes an alignment scope 105 fixed to the mold stage 104. The alignment scope 105 detects an alignment mark (substrate-side mark) 106 formed on the substrate W (its shot region) and an alignment mark (mold-side mark) 107 formed on the mold M (its pattern P). When detecting the substrate-side mark 106 and the mold-side mark 107, the alignment scope 105 can use interference signals such as moire signals reflecting the relative positions of the two marks. Alternatively, the alignment scope 105 may obtain the relative positions of the two marks by detecting images of the substrate-side mark 106 and the mold-side mark 107.

The control unit CNT obtains a relative positional shift between the mold M and the substrate W based on the detection results on the substrate-side mark 106 and the mold-side mark 107 obtained by the alignment scope 105. The control unit CNT then corrects the relative positional shift between the mold M and the substrate W by moving the substrate stage 102 and the mold stage 104 based on the relative positional shift between the mold M and the substrate W. Note that the relative positional shift between the mold M and the substrate W is not limited to a shift component and also includes a magnification component and a rotation component. In such a case, the shape of the pattern P of the mold M may be corrected in accordance with the shape of each shot region on the substrate.

The imprint apparatus 100 includes a light source 108 which emits ultraviolet light, a detection light source 109 which emits detection light, and a mirror 110. The mirror 110 includes a dichroic mirror. In this embodiment, the mirror 110 has the property of reflecting ultraviolet light from the light source 108 and transmitting detection light from the detection light source 109. While the imprint material R on the substrate is in contact with the mold M, the mirror 110 reflects ultraviolet light from the light source 108 to irradiate the imprint material R with the reflected light, thereby curing the imprint material R. This operation transfers the pattern P of the mold M onto the imprint material R on the substrate.

Detection light from the detection light source 109 is separated into light transmitted through the mold M and illuminating a shot region on the substrate and light reflected by the mold M (its pattern P). Light illuminating a shot region is reflected by the surface of the substrate W and detected by an image capturing unit CAM, together with light reflected by the mold M. Displaying an image corresponding to the detection light detected by the image capturing unit CAM on the monitor 111 allows the user to observe the state of imprint processing (for example, the contact state between the imprint material R on the substrate and the mold M).

Figure 4:
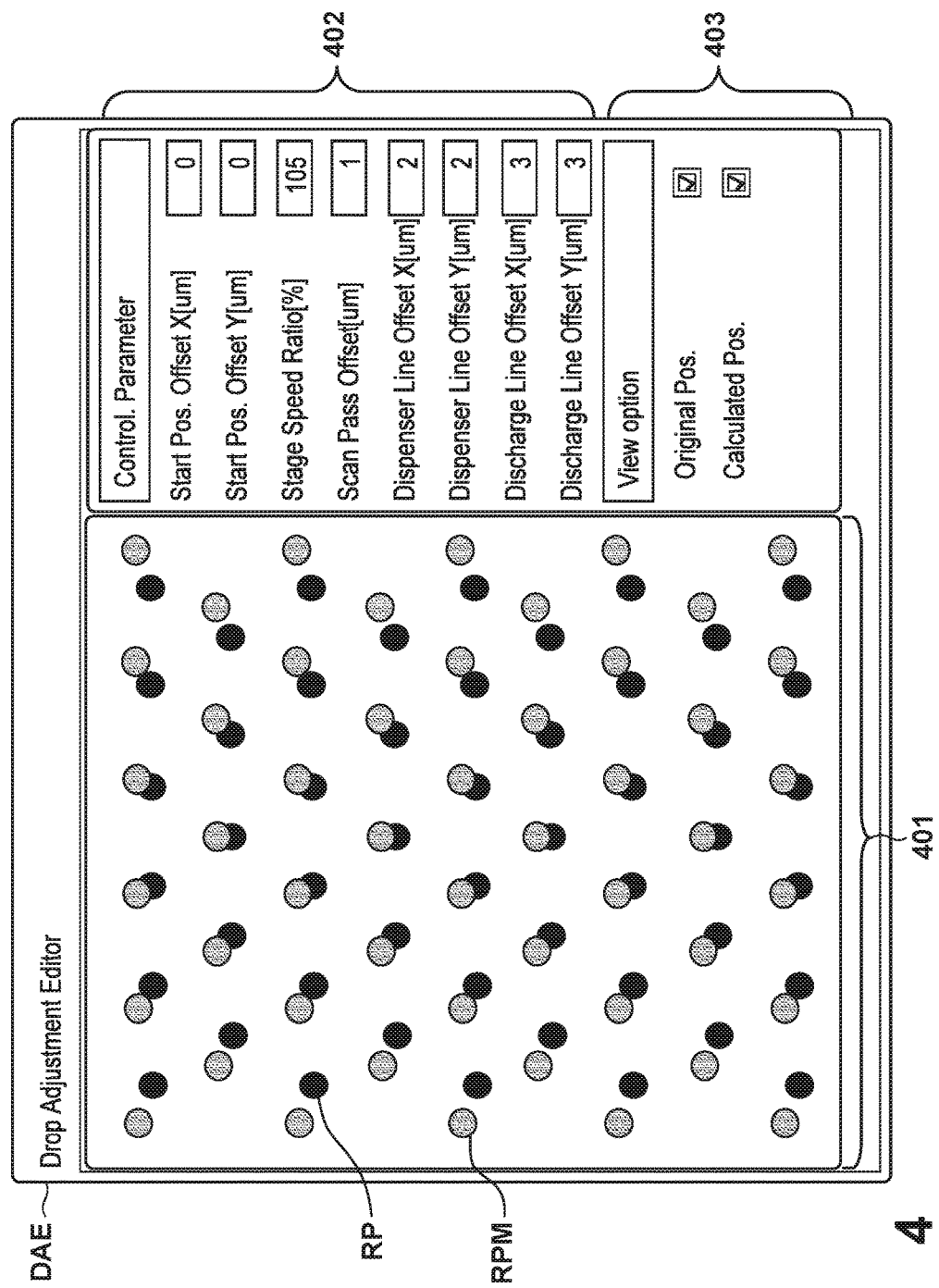
FIG. 4 is a view showing an example of an editing screen functioning as a user interface.

FIG. 4 is a view showing an example of an editing screen DAE functioning as a user interface. The editing screen DAE is used to generate and edit the map RP. The control unit CNT generates the editing screen DAE and provides it as a user interface. In this embodiment, the console unit CONS manages the editing screen DAE generated by the control unit CNT. The monitor 111 displays the editing screen DAE. Note, however, that either the control unit CNT of the imprint apparatus 100 or an information processing apparatus external to the imprint apparatus 100 may generate the editing screen DAE. Likewise, the monitor 111 of the imprint apparatus 100 or a monitor external to the imprint apparatus 100 may display the editing screen DAE.

The user adjusts the values of apparatus parameters for changing the supply positions of the imprint material R on the substrate based on the map RP stored in the imprint apparatus 100, thereby generating a map RPM after the adjustment of the values of the apparatus parameters. The map RPM (second map) is a map obtained by finely adjusting the supply positions of the imprint material R by adjusting the values of the apparatus parameters (that is, controlling the imprint apparatus 100) with respect to the map RP (first map). In other words, the map RPM indicates the array pattern of the imprint material R to be actually formed on the substrate.

The imprint apparatus 100 sometimes fails to sufficiently supply the imprint material R by only supplying the imprint material R to the supply positions of the imprint material R indicated in the map RP. For example, the imprint material R supplied to a shot region near the periphery of the substrate W based on the map RP sometimes protrudes out of the substrate W because the distance from the periphery of the substrate W is too short. In contrast, the imprint material R supplied to a shot region near the periphery of the substrate W based on the map RP does not sometimes sufficiently fill the pattern P of the mold M because the distance from the periphery of the substrate W is too long, resulting in the generation of an unfilled region. In such a case, changing the control of the imprint apparatus 100 by using apparatus parameters MP will generate the map RPM as a map obtained by changing the map RP.

As shown in FIG. 4, the editing screen DAE includes a map display area 401 for displaying the maps RP and RPM and a parameter display area 402 for displaying an adjustment window for adjusting (changing) the values of the apparatus parameters MP. In this case, the apparatus parameters MP are parameters set in the imprint apparatus 100 to change the supply positions of the imprint material R. In this manner, the control unit CNT provides the editing screen DAE as a user interface for displaying the map RP, the adjustment window, and the map RPM. Accordingly, the control unit CNT is configured to include a first display unit for displaying the maps RP and RPM on the user interface and a second display unit for displaying the adjustment window on the user interface. The editing screen DAE also includes an assist area 403 for displaying switching parameters for switching contents to be displayed in the map display area 401.

The apparatus parameters MP include the supply start position of the imprint material R in a shot region on a substrate and the speed of the substrate stage 102 at the time of supplying the imprint material R onto the substrate. The apparatus parameters MP also include the interval between the forward path and backward path of the substrate stage 102 at the time of supplying the imprint material R onto the substrate and the interval between a plurality of dispensers for supplying the imprint material R onto the substrate. In addition, the apparatus parameters MP include the interval between a plurality of discharge outlets (nozzles) for jetting the imprint material R onto the substrate and the timings of supplying the imprint material R onto the substrate. As described above, the apparatus parameters MP include at least one of the parameters described above.

Figure 5:
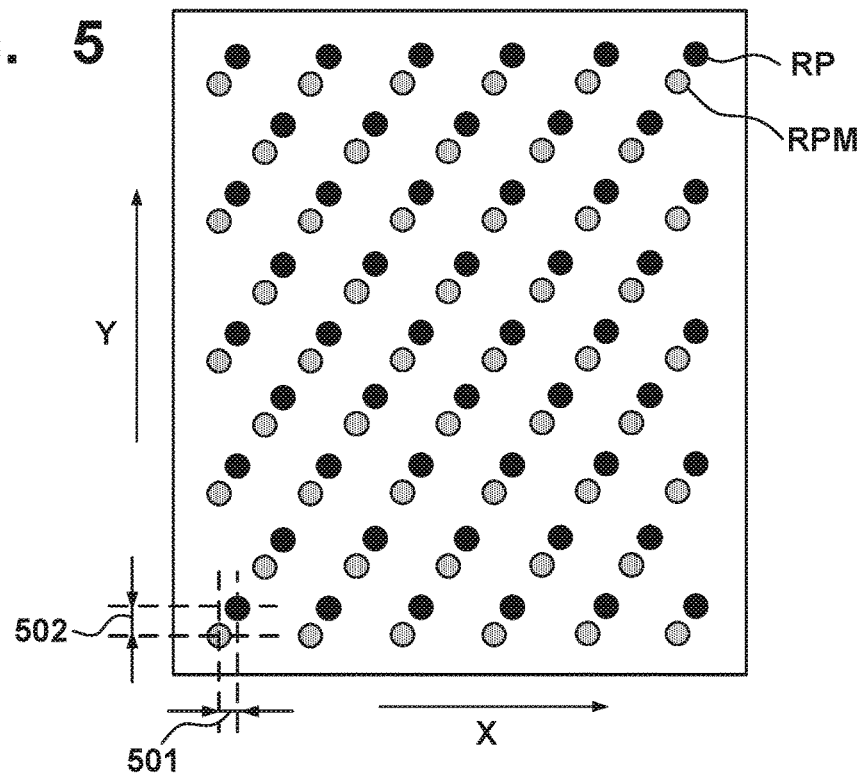
FIG. 5 is a view for explaining imprint material supply start position offsets.

The apparatus parameters MP will be described in detail. FIG. 5 is a view for explaining the offset of the supply start position of the imprint material R as one of the apparatus parameters MP. In this case, the supply start position of the imprint material R indicates the position at which the supply of the imprint material R starts in a shot region on a substrate. FIG. 5 shows an offset 501 of the supply start position of the imprint material R in the X direction and an offset 502 of the supply start position of the imprint material R in the Y direction. Using the offsets 501 and 502 can obtain the map RPM for supplying the imprint material R to a position shifted from the corresponding position in the map RP by distances corresponding to the offsets 501 and 502. The control unit CNT controls the timing of supplying (jetting) the imprint material R from the supply unit D based on the map RPM.

The relationship between the map RP and the map RPM is represented by equations (1) and (2) given below:

$$RPMx = RPx + StartOffsetx \quad (1)$$

$$RPMy = RPy + StartOffsety \quad (2)$$

In equations (1) and (2), RPx and RPy represent the supply position (coordinates) of the imprint material R indicated in the map RP. In addition, StartOffsetx and StartOffsety represent the offsets of the supply start position of the imprint material R as an apparatus parameter. Furthermore, RPMx and RPMy represent the supply position (coordinates) of the imprint material R indicated in the map RPM after the adjustment of the offset of the supply start position of the imprint material R.

The editing screen DAE allows the user to set the offsets 501 and 502, and displays the map RPM obtained from the set offsets 501 and 502. Accordingly, the user can easily check the map RPM after the adjustment of the offsets 501 and 502, that is, the array pattern of the imprint material R actually formed on the substrate, via the editing screen DAE displayed on the monitor 111.

Figure 6:
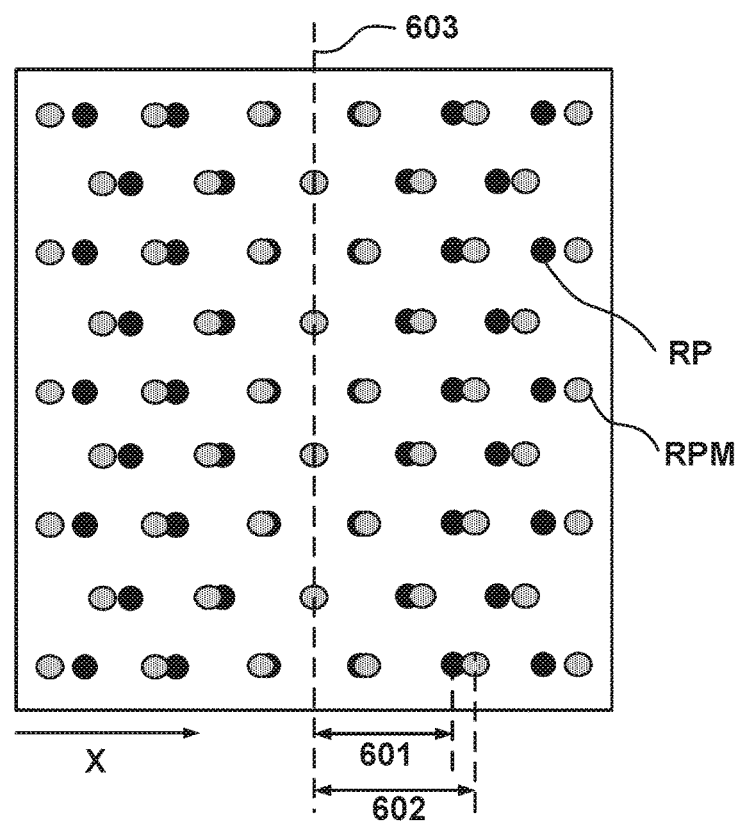
FIG. 6 is a view for explaining a substrate stage speed ratio.

FIG. 6 is a view for explaining the speed ratio of the substrate stage 102 as one of the apparatus parameters MP. Changing the speed ratio of the substrate stage 102 can supply the imprint material R onto the substrate at intervals different from the supply position intervals of the imprint material R indicated in the map RP. Increasing the speed ratio of the substrate stage 102 will increase the moving speed of the substrate stage 102, thus increasing the supply position intervals of the imprint material R on the substrate as compared with those of the imprint material R indicated in the map RP. In contrast to this, decreasing the speed ratio of the substrate stage 102 will decrease the moving speed of the substrate stage 102, thus decreasing the supply position intervals of the imprint material R on the substrate as compared with those of the imprint material R indicated in the map RP.

The relationship between the map RP and the map RPM obtained by adjusting the speed ratio of the substrate stage 102 is represented by equation (3) given below:

$$RPMx=(RPx-Basex)*SpeedRatio+Basex \qquad (3)$$

In equation (3), RPx represents the supply position (X-coordinate) of the imprint material R indicated in the map RP, and RPMx represents the supply position (X-coordinate) of the imprint material R indicated in the map RPM. In addition, Basex represents a reference position at the time of enlarging or reducing the map RP, and SpeedRatio represents the speed ratio of the substrate stage 102. Referring to FIG. 6, reference numerals 601, 602, and 603 respectively correspond to RPx, RPMx, and Basex.

The editing screen DAE allows the user to set the speed ratio of the substrate stage 102, and displays the map RPM obtained from the set speed ratio of the substrate stage 102. Accordingly, the user can easily check the map RPM after the adjustment of the speed ratio of the substrate stage 102, that is, the array pattern of the imprint material R actually formed on the substrate, via the editing screen DAE displayed on the monitor 111. Although this embodiment has exemplified the case in which the moving speed of the substrate stage 102 is changed by adjusting the speed ratio of the substrate stage 102, this is not exhaustive. For example, the supply positions of the imprint material R on the substrate may be changed by adjusting the timing of supplying (jetting) the imprint material R from the supply unit D.

Figure 7:
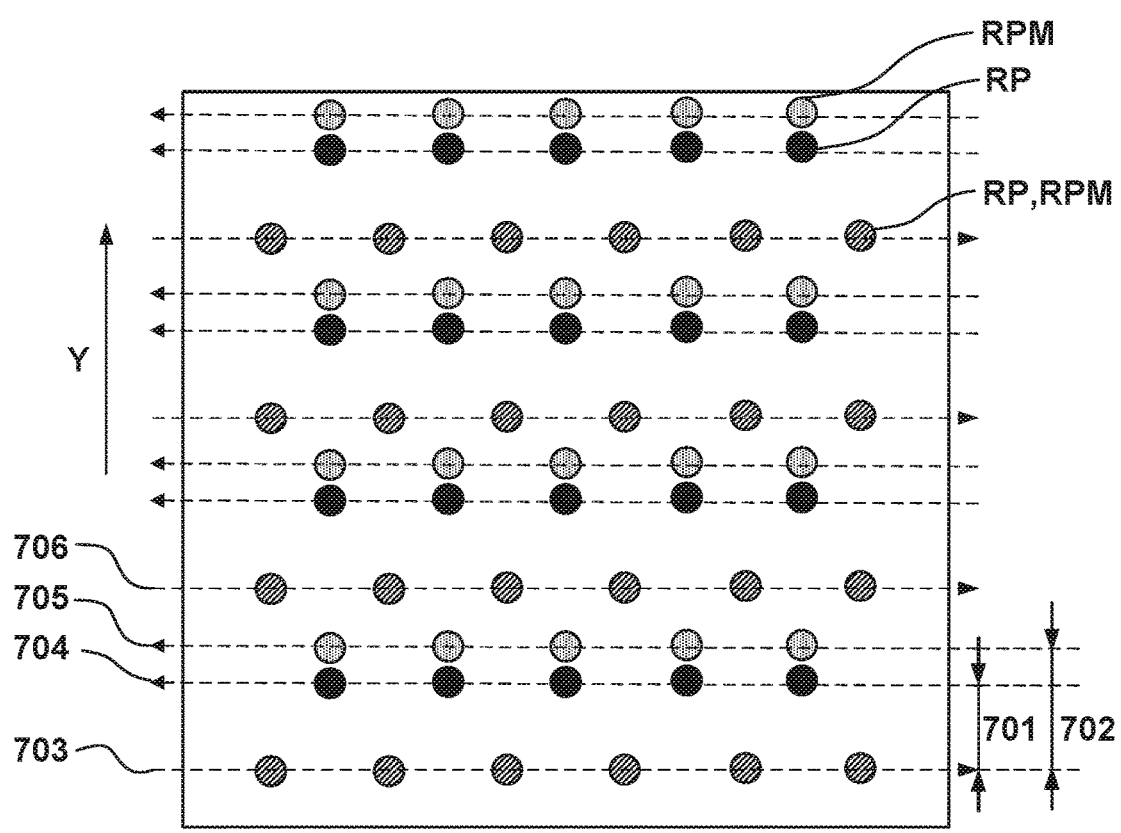
FIG. 7 is a view for explaining scan pass offsets.

FIG. 7 is a view for explaining a scan pass offset as one of the apparatus parameters MP. When the imprint material R is supplied from the supply unit D onto a substrate, it is possible to decrease the supply position intervals of the imprint material R on the substrate more by reciprocating the substrate W with respect to the supply unit D than by not reciprocating the substrate W (that is, by moving it along only forward paths) with respect to the supply unit D. Referring to FIG. 7, an arrow 703 indicates the imprint material R supplied onto the substrate along a forward path. At the time of switching from a forward path to a backward path, the substrate W is shifted by a distance 701 in the Y direction. An arrow 704 indicates the imprint material R supplied onto the substrate along a backward path. At the time of switching from a backward path to a forward path, the substrate W is shifted in the Y direction. An arrow 706 indicates the imprint material R supplied onto the substrate along a forward path. In general, the distance 701 is half the distance corresponding to the interval between adjacent forward paths (the distance between the arrows 703 and 706). At the time of switching from a forward path to a backward path, the substrate W is shifted by a distance 702 in the Y direction (the distance 701 is changed to the distance 702). This operation makes it possible to supply the imprint material R to the position indicated by an arrow 705 on the substrate (to change the supply position of the imprint material R on the substrate). The interval between the arrows 704 and 705 (that is, the interval between the forward path and backward path of the substrate W (substrate stage 102) at the time of supplying the imprint material R onto the substrate) is called a scan pass offset.

The relationship between the map RP and the map RPM obtained by adjusting a scan pass offset is represented by equation (4) given below:

$$RPMry=(RPry+ScanPassOffset) \qquad (4)$$

In equation (4), RPry represents the supply position (Y-coordinate) of the imprint material R supplied along a backward path in the map RP, and RPMry represents the supply position (Y-coordinate) of the imprint material R supplied along a backward path in the map RPM. The supply position RPMry of the imprint material R is changed with respect to the supply position RPry of the imprint material R in accordance with a scan pass offset ScanPassOffset.

The editing screen DAE allows the user to set a scan pass offset, and displays the map RPM obtained from the set scan pass offset. Accordingly, the user can easily check the map RPM after the adjustment of the scan pass offset, that is, the array pattern of the imprint material R actually formed on the substrate, via the editing screen DAE displayed on the monitor 111. Although in this embodiment, the substrate W is shifted in the Y direction in accordance with a scan pass offset, the substrate W may be shifted in the X direction.

Figure 8A:
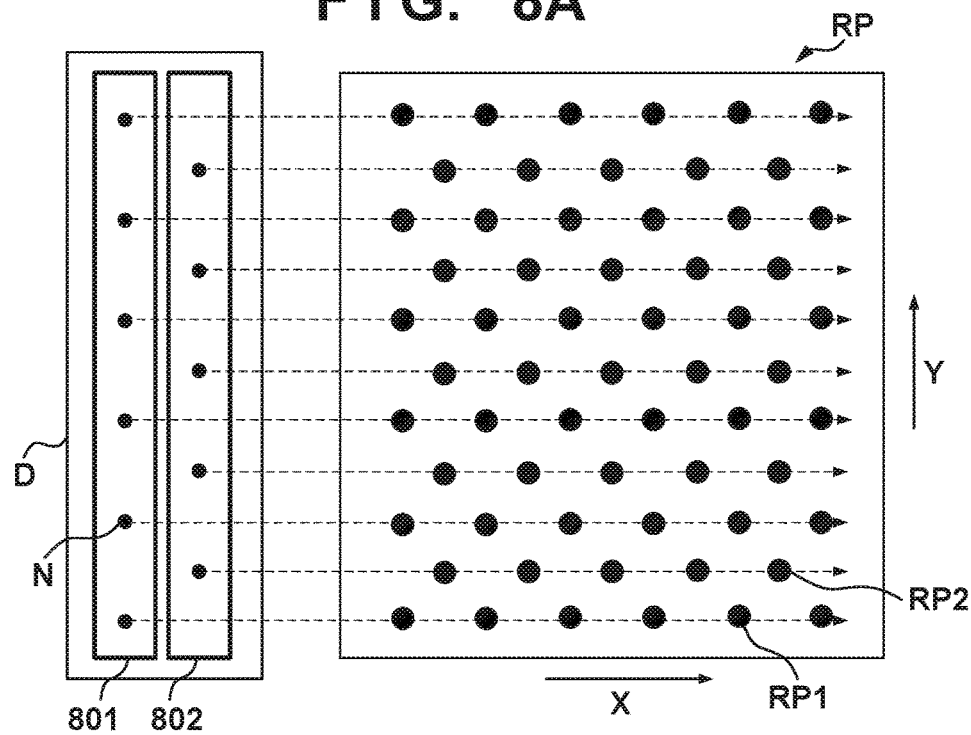
FIGS. 8A and 8B are views for explaining dispenser line offsets.
Figure 8B:
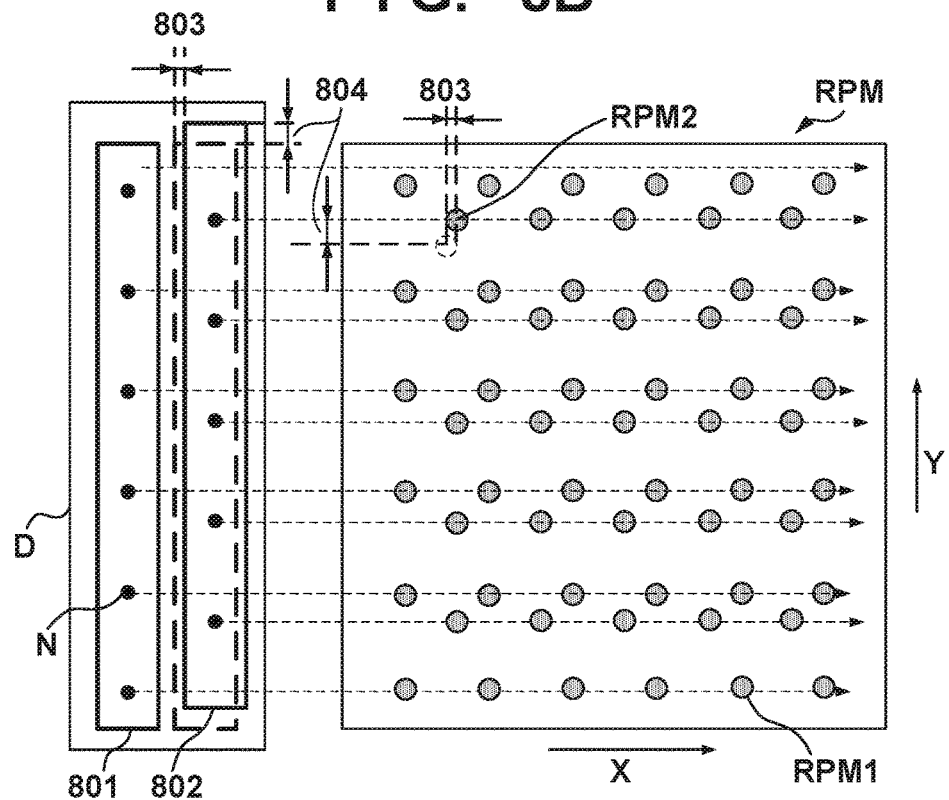

FIGS. 8A and 8B are views for explaining a dispenser line offset as one of the apparatus parameters MP. As shown in FIGS. 8A and 8B, when the supply unit D is constituted by a plurality of dispensers 801 and 802, the imprint material R supplied onto a substrate is supplied from the corresponding dispensers. A supply position RP1 of the imprint material R on the substrate indicates the position of the imprint material R supplied from the dispenser 801, and a supply position RP2 of the imprint material R on the substrate indicates the position of the imprint material R supplied from the dispenser 802. A dispenser line offset is the offset of the interval between the dispenser 801 and the dispenser 802. FIG. 8B shows a dispenser line offset 803 in the X direction and a dispenser line offset 804 in the Y direction. Setting a dispenser line offset will shift the position of the dispenser 802 with respect to the position of the dispenser 801. This shifts a supply position RPM2 of the imprint material R supplied from the dispenser 802 onto the substrate with respect to a supply position RPM1 of the imprint material R supplied from the dispenser 801 onto the substrate.

The relationship between the map RP and the map RPM obtained by adjusting dispenser line offsets is represented by equations (5) and (6) given below:

$$RPMx=(RPx+DispenserLineOffsetx) \qquad (5)$$

$$RPMy=(RPy+DispenserLineOffsety) \qquad (6)$$

In equations (5) and (6), RPx and RPy represent the supply position (coordinates) of the imprint material R indicated in the map RP. In addition, DispenserLineOffsetx and DispenserLineOffsety respectively represent the offsets of the intervals between the dispenser 801 and the dispenser 802 in the X and Y directions. RPMx and RPMy represent the supply position (coordinates) of the imprint material R indicated in the map RPM after the adjustment of dispenser line offsets.

The editing screen DAE allows the user to set dispenser line offsets, and displays the map RPM obtained from the set dispenser line offsets. Accordingly, the user can easily check the map RPM after the adjustment of the dispenser line offsets, that is, the array pattern of the imprint material R actually formed on the substrate, via the editing screen DAE displayed on the monitor 111. Although in this embodiment, the offsets of the physical distances between a plurality of dispensers have been described as dispenser line offsets, dispenser line offsets may be changed by changing the timing of supplying the imprint material R for each dispenser. In addition, the number of dispensers constituting the supply unit D is not limited to two.

Likewise, when the supply unit D is constituted by the plurality of discharge outlets N, a discharge line offset is also one of the apparatus parameters MP. In this case, changing the offsets of the intervals between the plurality of discharge outlets N can change the supply positions of the imprint material R supplied onto a substrate. In this case, the offsets of the intervals between the plurality of discharge outlets N are called discharge line offsets.

The relationship between the map RP and the map RPM obtained by adjusting discharge line offsets is represented by equations (7) and (8) given below:

$$RPMx=(RPx+DischargeLineOffsetx) \quad (7)$$

$$RPMy=(RPy+DischargeLineOffsety) \quad (8)$$

In equations (7) and (8), RPx and RPy represent the supply position (coordinates) of the imprint material R indicated in the map RP. In addition DischargeLineOffsetx and DischargeLineOffsety respectively represent the offsets of the intervals between the plurality of discharge outlets in the X and Y directions. RPMx and RPMy represent the supply position (coordinates) of the imprint material R indicated in the map RPM after the adjustment of the discharge line offsets.

The editing screen DAE allows the user to set discharge line offsets, and displays the map RPM obtained from the discharge line offsets. Accordingly, the user can easily check the map RPM after the adjustment of the discharge line offsets, that is, the array pattern of the imprint material R actually formed on the substrate, via the editing screen DAE displayed on the monitor 111. Although in this embodiment, the offsets of the physical distances between a plurality of discharge outlets have been described as discharge line offsets, discharge line offsets may be changed by changing the timing of supplying the imprint material R for each discharge outlet.

Figure 9:
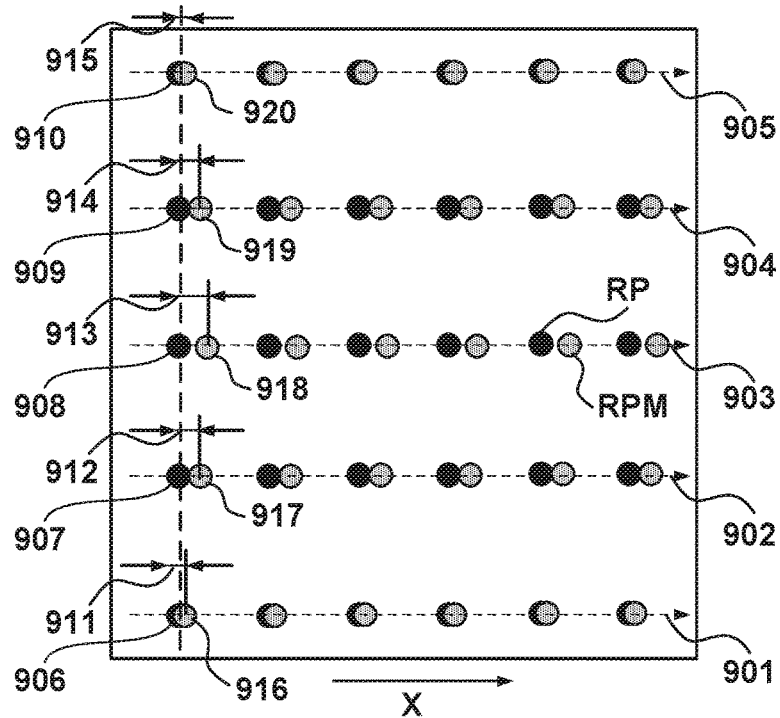
FIG. 9 is a view for explaining the offsets of the timings of supplying an imprint material from a supply unit.

FIG. 9 is a view for explaining the offset of the timing of supplying the imprint material R from the supply unit D as one of the apparatus parameters MP. Jetting (supplying) the imprint material R from the discharge outlets N of the supply unit D during the movement of the substrate W in the X direction can supply the imprint material R to positions on the substrate which face the discharge outlets N, as shown in FIG. 9. FIG. 9 shows moving paths 901, 902, 903, 904, and 905 of the plurality of discharge outlets N constituting the supply unit D on the substrate. FIG. 9 also shows offsets 911, 912, 913, 914, and 915 of the timings of jetting the imprint material R from the plurality of discharge outlets N. Changing the offsets 911 to 915 can change the supply positions of the imprint material R in the moving direction of the substrate W between the plurality of discharge outlets N. As shown in FIG. 9, it is possible to change supply positions 906, 907, 908, 909, and 910 of the imprint material R on the substrate into supply positions 916, 917, 918, 919, and 920 of the imprint material on the substrate.

The relationship between the map RP and the map RPM obtained by adjusting the offsets 911, 912, 913, 914, and 915 is represented by equation (9) given below:

$$RPMnx=(RPnx+DischargeTimingOffsetxn) \quad (9)$$

In equation (9), RPnx represents the supply position (X-coordinate) of the imprint material R supplied from the nth discharge outlet N in the map RP. In addition, DischargeTimingOffsetn represents the offset of the timing of jetting the imprint material R from the nth discharge outlet N. RPMn represents the supply position (X-coordinate) of the imprint material R supplied from the nth discharge outlet N in the map RPM.

The editing screen DAE allows the user to set offsets 911, 912, 913, 914, and 915, and displays the map RPM obtained from the set offsets 911, 912, 913, 914, and 915. Accordingly, the user can easily check the map RPM after the adjustment of the offsets 911, 912, 913, 914, and 915, that is, the array pattern of the imprint material R actually formed on the substrate, via the editing screen DAE displayed on the monitor 111.

Figure 10:
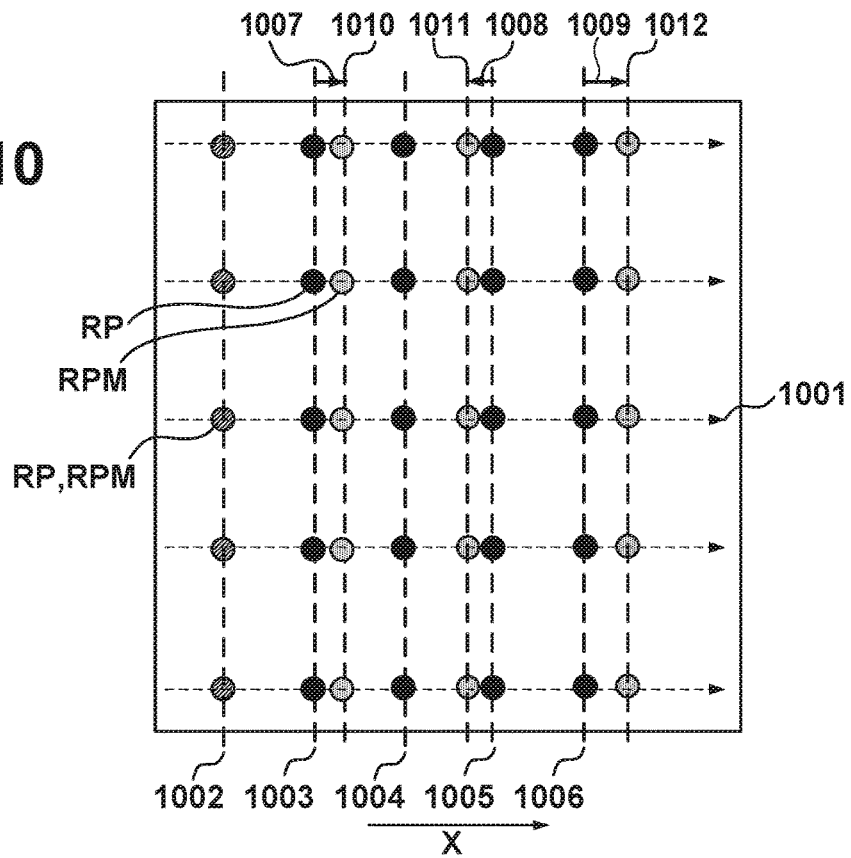
FIG. 10 is a view for explaining the offsets of the timings of supplying an imprint material from the supply unit.

FIG. 10 is a view for explaining each offset of the timing of supplying the imprint material R from the supply unit D as one of the apparatus parameters MP. In normal times, while the substrate W is moved in the X direction, the imprint material R is jetted from the discharge outlets N constituting the supply unit D at predetermined time intervals. With this operation, as shown in FIG. 10, the imprint material R is supplied to supply positions 1002, 1003, 1004, 1005, and 1006 of the imprint material R on the substrate at predetermined intervals. FIG. 10 shows a direction 1001 in which the imprint material R is supplied. In contrast to this, adding offsets 1007, 1008, and 1009 to the timings of jetting the imprint material R from the discharge outlets N can shift the supply positions of the imprint material R on the substrate. Setting the offsets 1007, 1008, and 1009 with respect to the plurality of discharge outlets N, respectively, can supply the imprint material R to supply positions 1010, 1011, and 1012 different from supply positions when the imprint material R is jetted at predetermined intervals. In this embodiment, different values are respectively set as the offsets 1007, 1008, and 1009. For example, the supply position 1010 (or 1012) exists in the positive X direction with respect to the supply position 1003 (or 1006) without any offset being set. In addition, the supply position 1011 exists in the negative X direction with respect to the supply position 1005 without any offset being set.

The relationship between the map RP and the map RPM obtained by adjusting the offsets 1007, 1008, and 1009 is represented by equation (10) given below:

$$RPMnx=(RPnx+JettingTimingOffsetxn) \quad (10)$$

In equation (10), RPnx represents the supply position (X-coordinate) of the imprint material R supplied from the nth discharge outlet N in the map RP. In addition, JettingTimingOffsetn represents the offset of the timing of jetting the imprint material R from the nth discharge outlet N. RPMnx represents the supply position (X-coordinate) of the imprint material R supplied from the nth discharge outlet N in the map RPM.

The editing screen DAE allows the user to set offsets 1007, 1008, and 1009, and displays the map RPM obtained from the set offsets 1007, 1008, and 1009. Accordingly, the user can easily check the map RPM after the adjustment of the offsets 1007, 1008, and 1009, that is, the array pattern of the imprint material R actually formed on the substrate, via the editing screen DAE displayed on the monitor 111.

Figure 11:
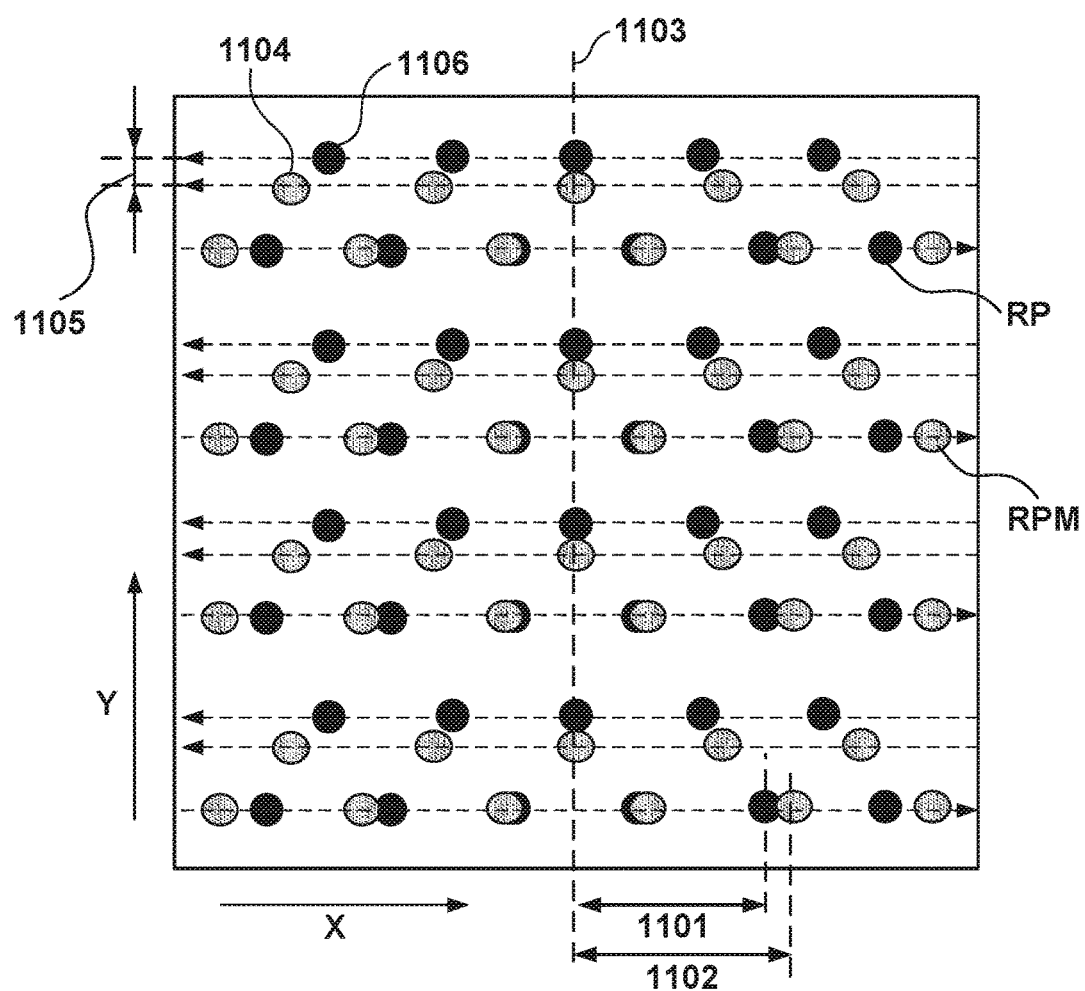
FIG. 11 is a view for explaining a case in which a plurality of apparatus parameters are combined.

FIG. 11 is a view for explaining a case in which a plurality of parameters of the apparatus parameters MP are combined. FIG. 11 will exemplify a case in which the speed ratio of the substrate stage 102 and a scan pass offset are combined. As shown in FIG. 11, changing the speed ratio of the substrate stage 102 with reference to a reference position 1103 can increase the interval between the supply positions of the imprint material R on the substrate. For example, this operation can shift a supply position 1101 of the imprint material R on the substrate to a supply position 1102. In addition, setting a scan pass offset 1105 can shift, for example, a supply position 1104 of the imprint material R in the Y direction in a forward path to the supply position 1105.

The relationship between the map RP and the map RPM obtained by adjusting the speed ratio of the substrate stage 102 and a scan pass offset is represented by a combination of equations (3) and (4). Note that other parameters of the apparatus parameters MP can be combined in the same manner as described above.

When the user adjusts (changes) the values of the apparatus parameters MP via the editing screen DAE in this manner, the operation of the substrate stage 102 or the supply unit D changes, thus obtaining the map RPM from the map RP. In addition, in this embodiment, because the map RPM is displayed on the editing screen DAE, the user can grasp the map RPM, that is, the array pattern of the imprint material R actually formed on the substrate, before the supply of the imprint material R onto the substrate. In the embodiment, this allows the user to change the map RP while checking the map RPM, and hence can improve the editing efficiency of the map RP. In addition, checking the map RPM before the supply of the imprint material R onto the substrate allows the user to grasp the supply of the imprint material R to an abnormal position on the substrate, thereby contribution to an improvement in yield. In contrast to this, according to the related art, because the map RPM is not displayed, the user cannot grasp the array pattern of the imprint material R actually formed on the substrate unless checking the result obtained by actually supplying the imprint material R onto the substrate.

Figure 12:
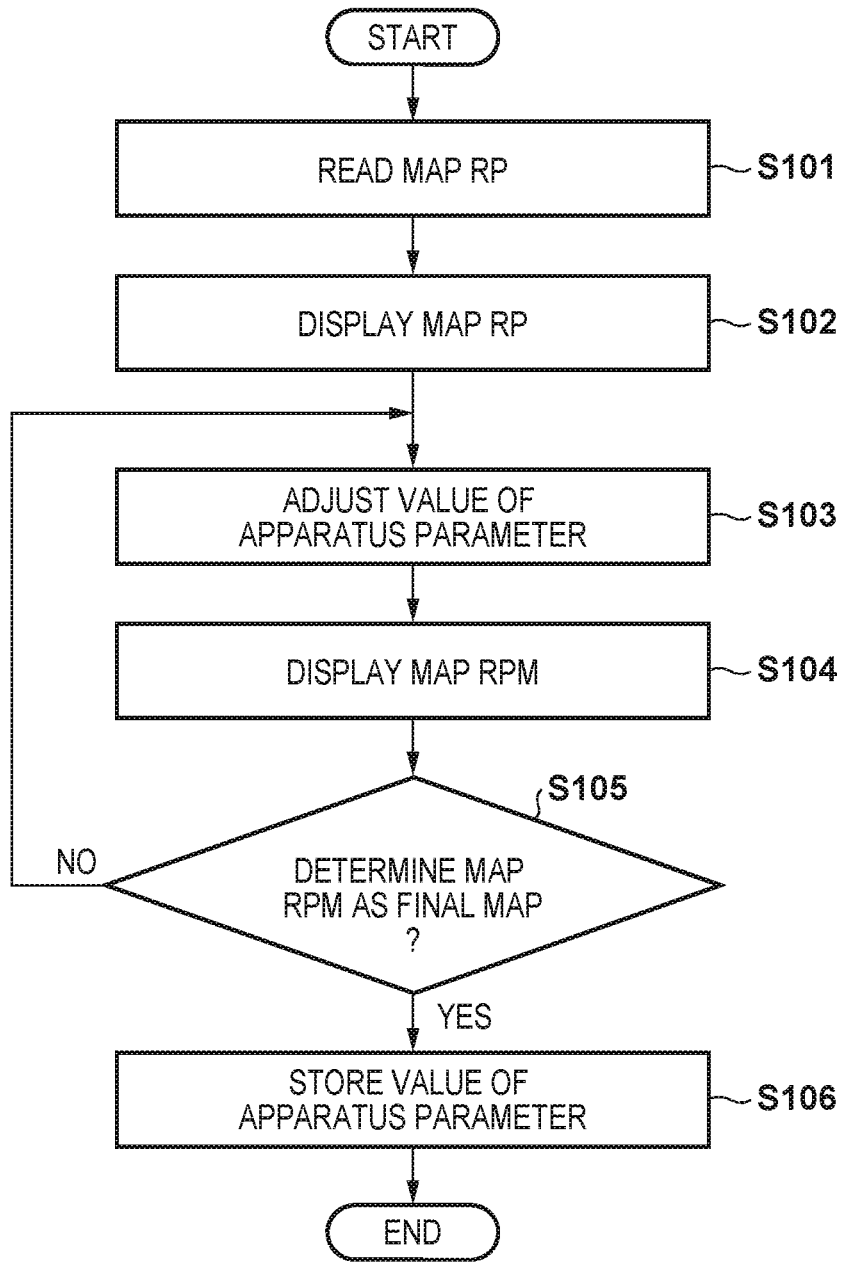
FIG. 12 is a flowchart for explaining a process of determining an apparatus parameter according to this embodiment.

This embodiment will exemplify a process of determining the apparatus parameters MP provided by the editing screen DAE. FIG. 12 is a flowchart for explaining the process of determining the apparatus parameters MP according to this embodiment. In such a determination process, the user checks the map RPM while adjusting the apparatus parameters MP, and determines the apparatus parameters MP.

In step S101, the editing screen DAE is started up, and the user designates the map RP as a target from a selection screen (not shown) to read the map RP in the editing screen DAE. In step S102, the map RP read in step S101 is displayed in the map display area 401 of the editing screen DAE.

Figure 13:
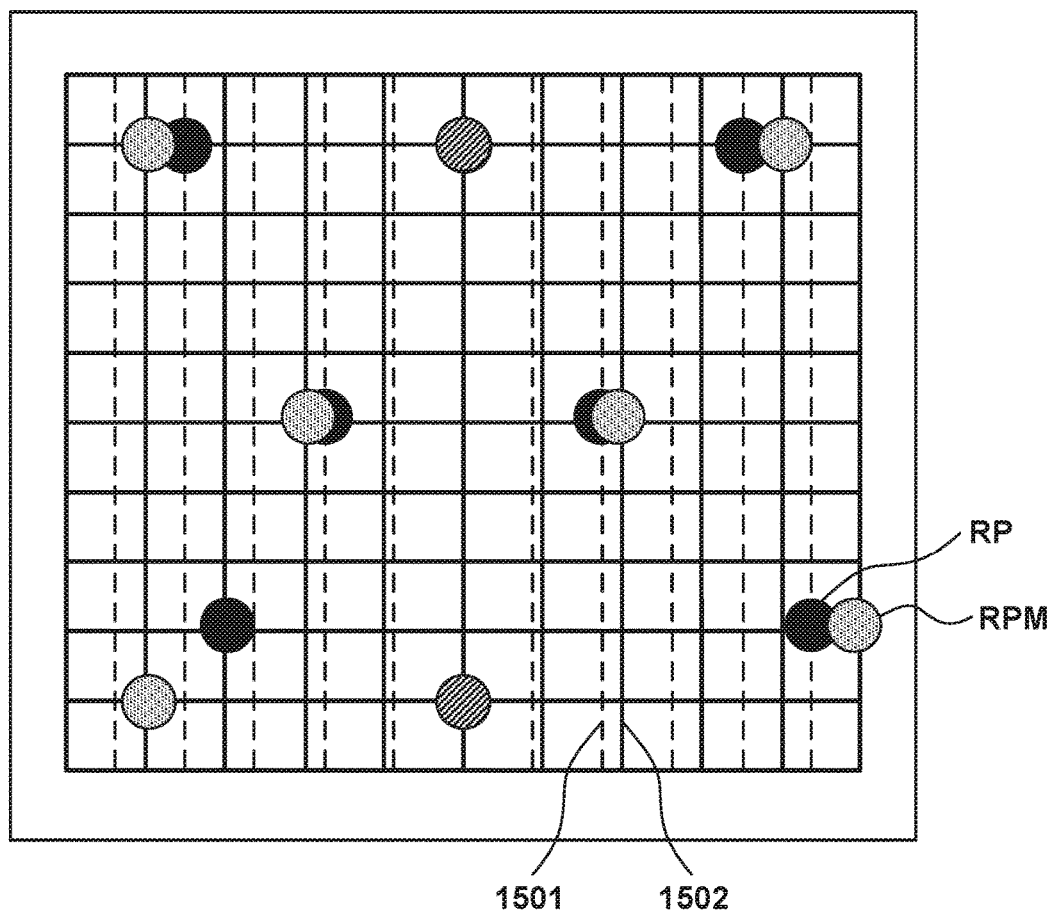
FIG. 13 is a view showing an example of a map displayed in a map display area in step S104 in FIG. 12.
Figure 15:
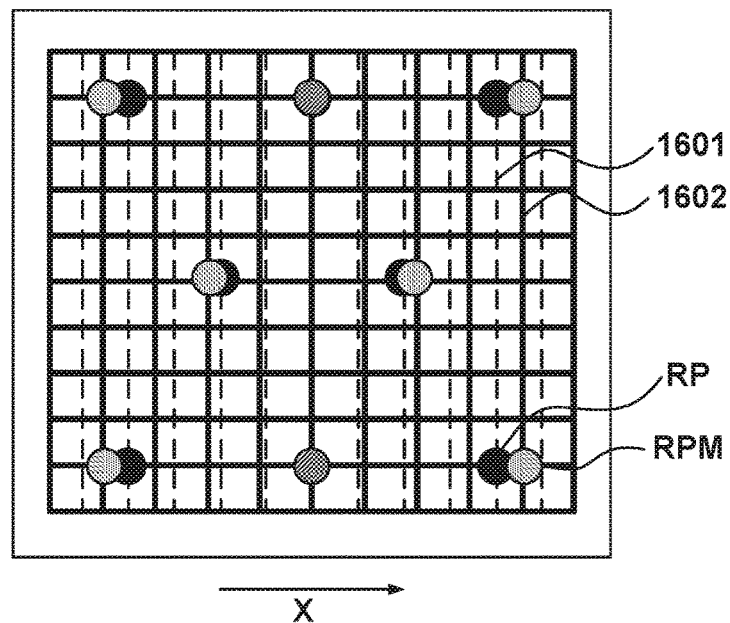
FIG. 15 is a view showing an example of a map displayed on an editing screen.

In step S103, the user adjusts the values of the apparatus parameters MP displayed in the parameter display area 402 via the editing screen DAE (adjustment window). In this case, the input device 112 functions as an input unit with which the user inputs the values of the apparatus parameters MP via the editing screen DAE. In step S104, the map RPM as a map after the adjustment of the apparatus parameters MP is displayed in the map display area 401 of the editing screen DAE based on the values of the apparatus parameters MP adjusted in step S103. FIG. 13 shows an example of the map RPM displayed in the map display area 401 in step S104. In this embodiment, as shown in FIG. 13, the map RP and the map RPM are superimposed and displayed in the map display area 401. For example, as shown in FIG. 15, changing the speed ratio of the substrate stage 102 will convert a grid 1501 defining positions on the substrate to which the imprint material R can be supplied into a grid 1502. With this operation, it is possible to obtain the map RPM with respect to the map RP.

In step S105, the user checks the map RPM displayed in the map display area 401 in step S104 to determine the validity of the map RPM, that is, whether to determine the map RPM as a final map indicating the supply positions of the imprint material R on the substrate. If the user does not determine the map RPM as a final map, the process shifts to step S103 to repeat steps S103, S104, and S105. If the user determines the map RPM as a final map, the process shifts to step S106.

In step S106, the values of the apparatus parameters MP adjusted in step S103 are stored. The values of the apparatus parameters MP may be stored so as to be reflected in a storage device (database) of the imprint apparatus 100 or may be stored as a file which is not reflected in the storage device.

As described above, this embodiment allows the user to check the map RPM obtained from the values of the apparatus parameters MP every time the values of the apparatus parameters MP are adjusted. This makes it possible to effectively determine the apparatus parameters MP.

Figure 14:
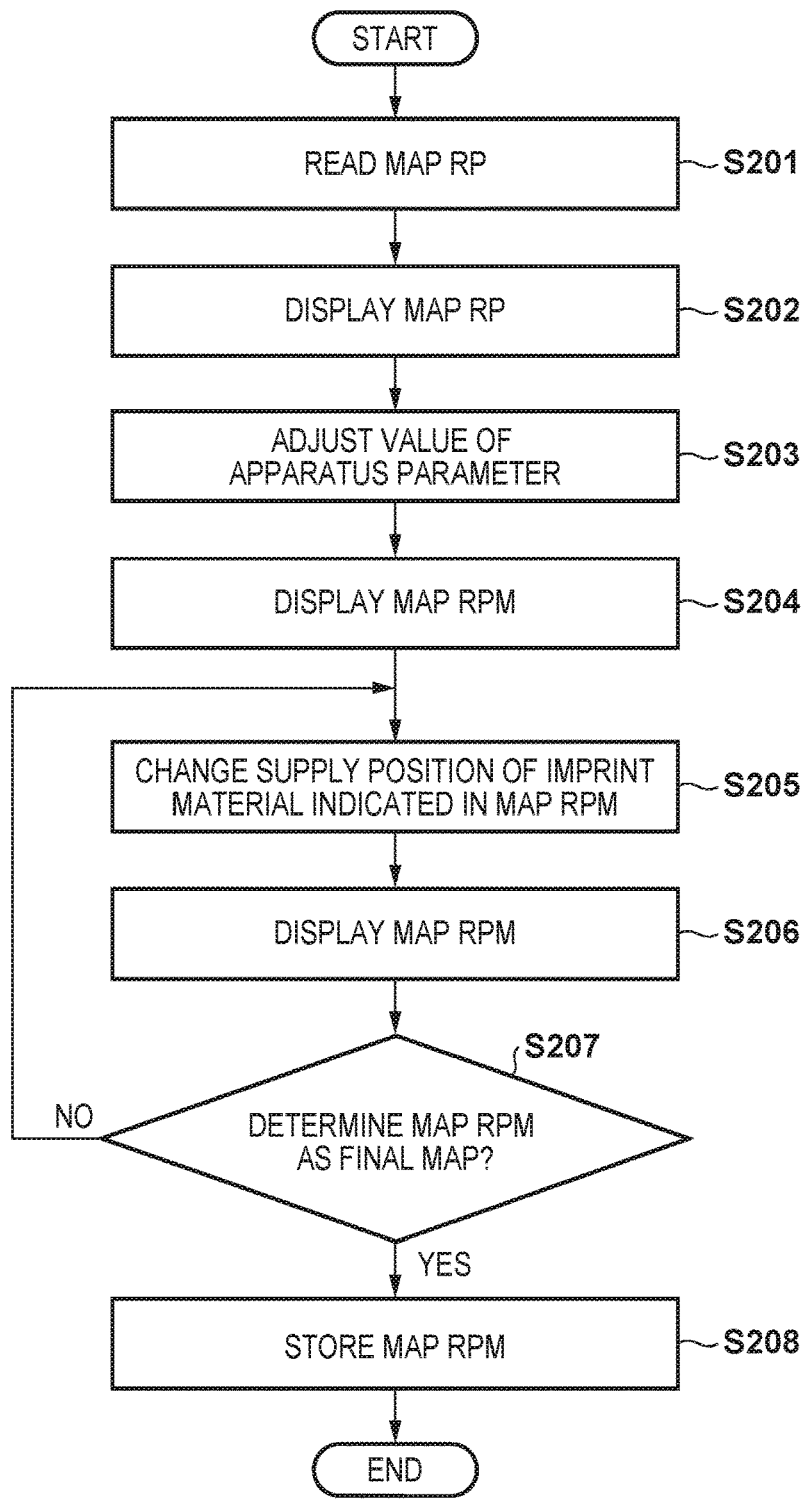
FIG. 14 is a flowchart for explaining a process of determining a final map according to this embodiment.

This embodiment will exemplify a process of determining a final map to be provided on the editing screen DAE, which indicates the supply positions of the imprint material R on the substrate. FIG. 14 is a flowchart for explaining the process of determining a final map indicating the supply positions of the imprint material R on the substrate. In this determination process, the user checks the map RPM while changing the supply positions of the imprint material R on the substrate, which are indicated in the map RP, and determines a final map.

In step S201, the editing screen DAE is started up, and the user designates the map RP as a target from a selection screen (not shown) to read the map RP in the editing screen DAE. In step S202, the map RP read in step S201 is displayed in the map display area 401 of the editing screen DAE.

In step S203, the user adjusts the values of the apparatus parameters MP displayed in the parameter display area 402 via the editing screen DAE (adjustment window). In step S204, the map RPM as a map after the adjustment of the apparatus parameters MP based on the values of the apparatus parameters MP adjusted in step S203 is displayed in the map display area 401 of the editing screen DAE.

In step S205, the user changes the supply positions of the imprint material R on the substrate, indicated in the map RPM displayed in step S204, via the editing screen DAE (map display area 401). In step S205, the map RPM obtained by changing the supply positions of the imprint material R on the substrate (that is, reflecting changes in supply positions) in step S204 is displayed in the map display area 401 of the editing screen DAE. In this case, the values of the apparatus parameters MP which are required to supply the imprint material R to the supply positions after the changes are obtained, and the obtained values of the apparatus parameters MP are displayed in the parameter display area 402.

In step S207, the user checks the map RPM displayed in the map display area 401 in step S206 to determine the validity of the map RPM, that is, whether to determine the map RPM as a final map indicating the supply positions of the imprint material R on the substrate. If the user does not determine the map RPM as a final map, the process shifts to step S205 to repeat steps S205 and S206. If the user determines the map RPM as a final map, the process shifts to step S208. In step S208, the map RPM displayed in the map display area 401 in step S206 is stored as a final map.

As described above, this embodiment allows the user to check the map RPM obtained from the values of the apparatus parameters MP and change the supply positions of the imprint material R on the substrate indicated in the map RPM every time the values of the apparatus parameters MP are adjusted. This makes it possible to efficiently determine a final map indicating the supply positions of the imprint material R to be supplied onto the substrate.

Note that in this embodiment, a final map is determined based on the map RPM after the adjustment of the values of the apparatus parameters MP. However, this is not exhaustive. For example, the user may change the supply positions of the imprint material R on the substrate, indicated in the map RP displayed in step S202, via the editing screen DAE (map display area 401), and may obtain the map RPM and the values of the apparatus parameters MP in accordance with the changes.

The auxiliary function of the editing screen DAE will be described. FIG. 15 is a view showing an example of the map RP and the map RPM displayed in the map display area 401 of the editing screen DAE. The prospective supply positions of the imprint material R on the substrate are subjected to restriction in accordance with the intervals between the plurality of discharge outlets N constituting the supply unit D and the timings of jetting the imprint material R from the discharge outlets N. As shown in FIG. 15, a grid (its intersections) 1601 defining the prospective supply positions of the imprint material R on the substrate is changed to a grid 1602 upon adjustment of the speed ratio of the substrate stage 102 as one of the values of the apparatus parameters MP. In addition, when another value of the apparatus parameters MP is adjusted, the grid 1601 is changed into the grid 1602. As shown in FIG. 15, the grids 1601 and 1602 and the maps RP and RPM are superimposed and displayed in the map display area 401 of the editing screen DAE. This allows the user to efficiently determine the maps RP and RPM and the values of the apparatus parameters MP while grasping the prospective supply positions of the imprint material R on the substrate.

Figure 16:
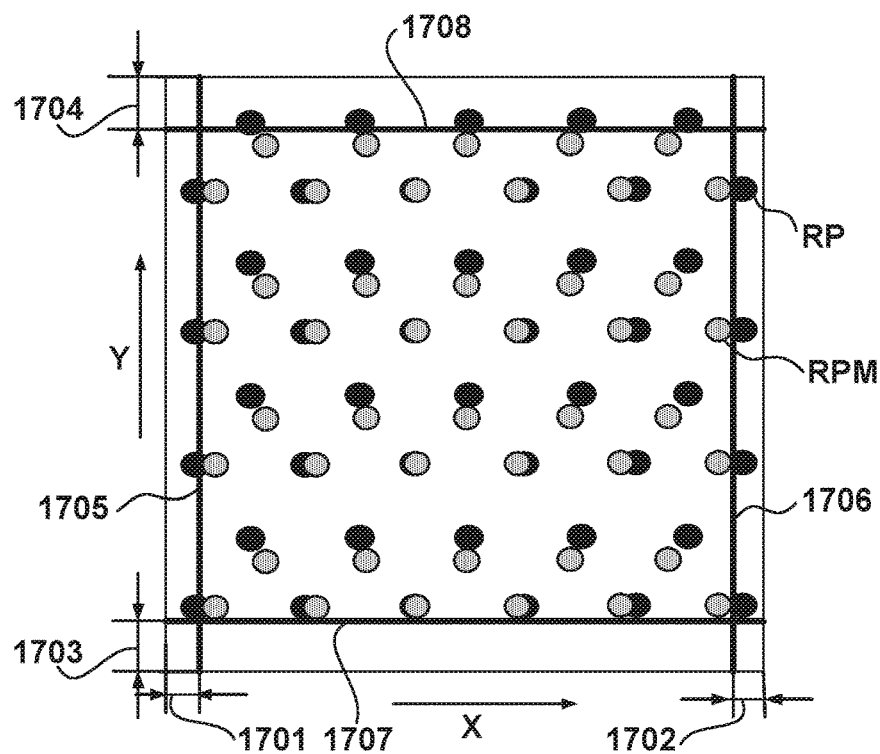
FIG. 16 is a view showing an example of a map displayed on the editing screen.

FIG. 16 is a view showing an example of the maps RP and RPM displayed in the map display area 401 of the editing screen DAE. The imprint material R supplied onto the substrate spreads when coming into contact with the mold M. In this case, when the imprint material R on the substrate spreads out of the mold M on the outer periphery of the substrate W, the imprint material R protruding from the mold M become a foreign substance to cause a defect. For this reason, there is a region, on the substrate, into which the supply of the imprint material R is inhibited.

Accordingly, as shown in FIG. 16, the region on the substrate in which the supply of the imprint material R is inhibited and the maps RP and RPM are superimposed and displayed in the map display area 401 of the editing screen DAE. The region on the substrate in which the supply of the imprint material R is inhibited is defined by lines 1705, 1706, 1707, and 1708. Note that the size of the region on the substrate in which the supply of the imprint material R is inhibited is set by adjusting distances 1701 and 1702 from the outer periphery of the substrate W in the X direction and distances 1703 and 1704 from the outer periphery of the substrate W in the Y direction. This makes it possible to change the size of the region on the substrate in which the supply of the imprint material R is inhibited in accordance with differences in the characteristics of the imprint material R and processes.

Referring to FIG. 16, the map RP including the supply positions of the imprint material R in the region on the substrate in which the supply of the imprint material R is inhibited is changed into the map RPM excluding supply positions of the imprint material R in the region on the substrate in which the supply of the imprint material R is inhibited. For example, with regard to the X direction, reducing the speed ratio of the substrate stage 102 can shift the supply positions of the imprint material R, existing within the region on the substrate in which the supply of the imprint material R is inhibited, inward from the region on the substrate in which the supply of the imprint material R is inhibited. With regard to the Y direction, adjusting a scan pass offset can shift the supply positions of the imprint material R, existing within the region on the substrate in which the supply of the imprint material R is inhibited, inward from the region on the substrate in which the supply of the imprint material R is inhibited.

In this manner, the user can efficiently determine the maps RP and RPM and the values of the apparatus parameters MP while grasping the region on the substrate in which the supply of the imprint material R is inhibited. In addition, it is possible to inhibit defects caused when the imprint material R on the substrate spreads out of the mold M. Note that in this embodiment, the region on the substrate in which the supply of the imprint material R is inhibited is a rectangular region. However, this is not exhaustive. For example, the region on the substrate in which the supply of the imprint material R is inhibited may have a shape including curved lines such as a circular shape.

Figure 17A:
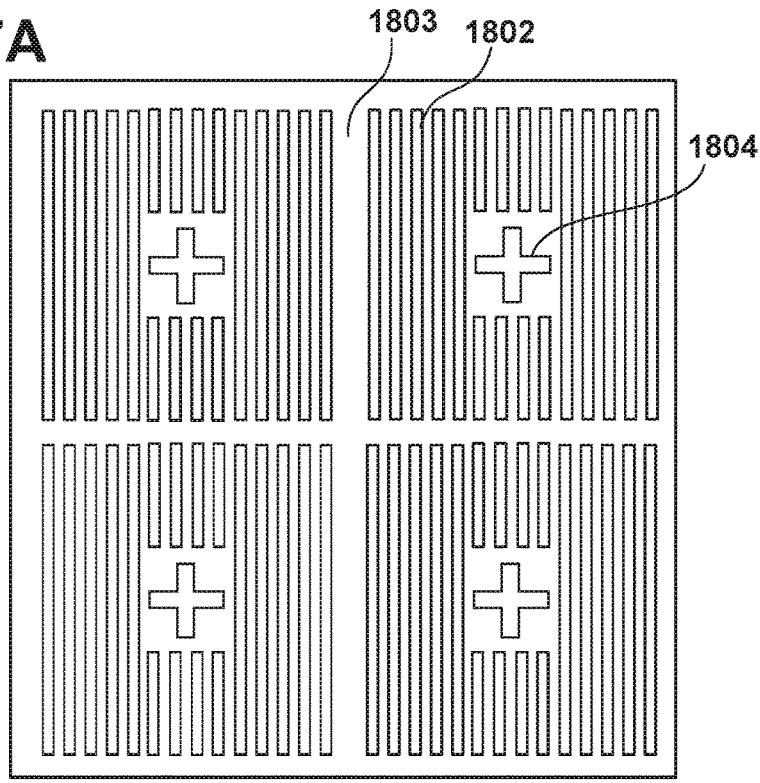
FIGS. 17A and 17B are views for explaining the auxiliary functions provided on the editing screen.

As shown in FIG. 17A, the pattern P of the mold M is formed from a combination of various types of patterns. In this embodiment, the pattern P of the mold M includes circuit patterns 1802 to be formed on the substrate W and mark patterns 1804 used for alignment with the mold M. The mold M also include a region 1803 having no pattern. The amount of the imprint material R to be supplied onto a substrate and the manner of how the imprint material R spreads vary depending on the pattern P of the mold M. It is therefore necessary to supply the imprint material R in accordance with the pattern P of the mold M.

Figure 17B:
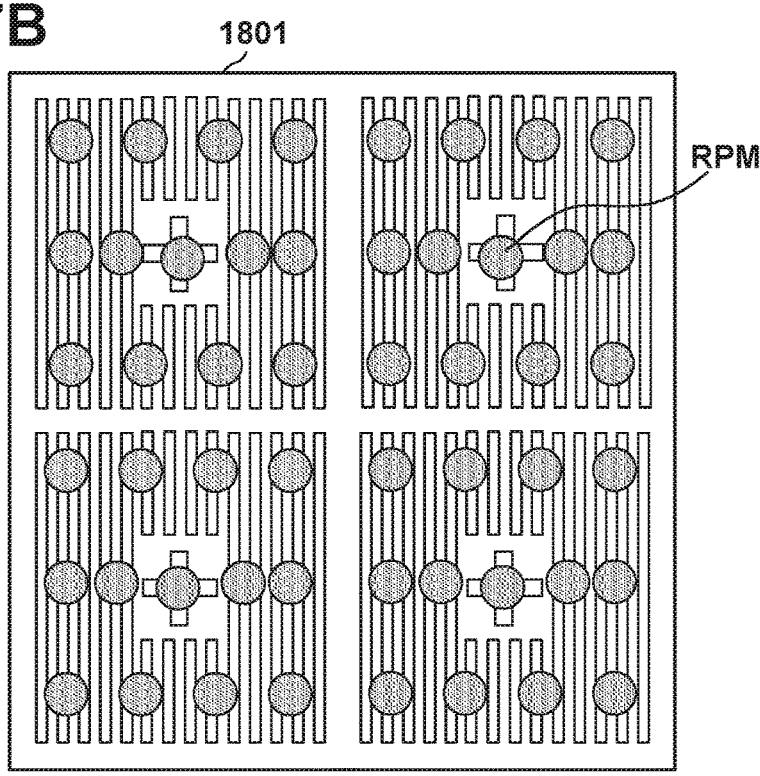

Accordingly, as shown in FIG. 17B, at least part of the pattern P of the mold M and the map RPM are superimposed and displayed in the map display area 401 of the editing screen DAE. This allows the user to efficiently determine the map RPM and the values of the apparatus parameters MP while checking the pattern P of the mold M. For example, the supply positions of the imprint material R on the substrate are adjusted to supply the imprint material R to the region including the circuit patterns 1802 and the mark patterns 1804 and not to supply the imprint material R to the region 1803 including no patterns.

In this manner, it is possible to efficiently determine the map RPM and the values of the apparatus parameters MP in accordance with the pattern P of the mold M. The mark pattern 1804 has a deep groove, in particular, and hence it is necessary to supply the imprint material R in large amount to that region on the substrate which corresponds to a region near the mark pattern 1804. In contrast to this, the imprint material R may be supplied in a small amount or not supplied at all to the region 1803 including no patterns. Although FIG. 17B shows only the map RPM, it is possible to show only the map RP or both the maps RP and RPM. In addition, at least part of the pattern of the mold M to be superimposed on the map RP and the map RPM may include at least one of the circuit pattern 1802, the mark pattern 1804, and the boundary portion between the circuit pattern 1802 and the mark pattern 1804.

Figure 18:
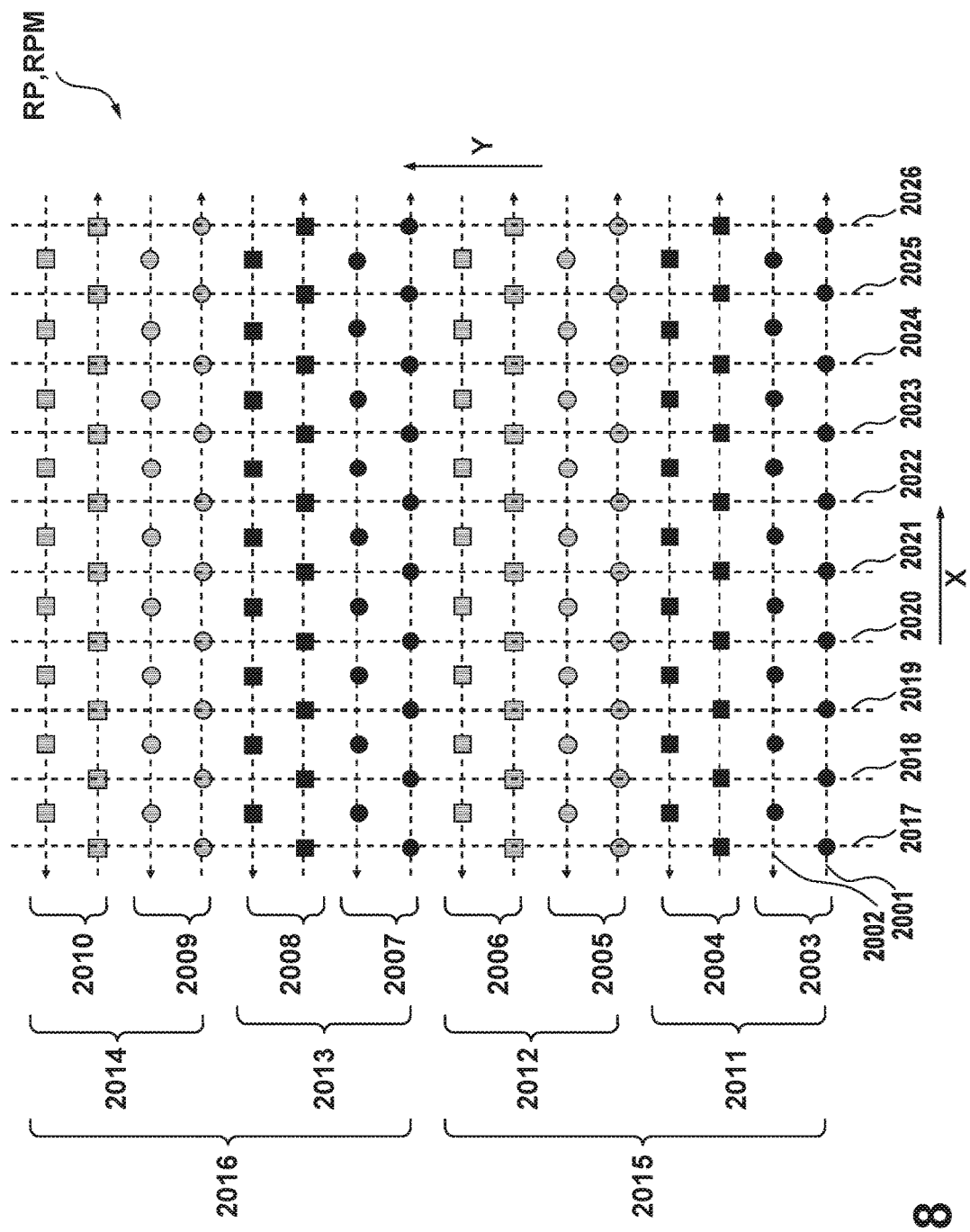
FIG. 18 is a view showing an example of a map displayed on the editing screen.

FIG. 18 is a view showing an example of the map RP (or RPM) displayed in the map display area 401 of the editing screen DAE. As shown in FIG. 18, the imprint material R to be supplied onto the substrate is supplied at specific timings from the specific discharge outlets N constituting the supply unit D. For example, the supply positions of the imprint material R on the substrate which exist on an arrow 2001 indicate the positions on the substrate stage 102 (substrate W) to which the imprint material R is supplied along a forward path. The supply positions of the imprint material R on the substrate which exist on an arrow 2002 indicate the positions on the substrate stage 102 (substrate W) to which the imprint material R is supplied along a backward path.

When the supply unit D is constituted by two dispensers, the supply positions of the imprint material R on a substrate which exist in ranges 2011 and 2013 indicate the positions to which the first dispenser supplies the imprint material R. On the other hand, the supply positions of the imprint material R on the substrate which exist in ranges 2012 and 2014 indicate the positions to which the second dispenser supplies the imprint material R.

When one dispenser is constituted by two discharge outlet groups, the supply positions of the imprint material R on the substrate which exist in ranges 2003, 2005, 2007, and 2009 indicate the positions to which the imprint material R is supplied from the first discharge outlet group. On the other hand, the supply positions of the imprint material R on the substrate which exist in ranges 2004, 2006, 2008, and 2010 indicate the positions to which the imprint material R is supplied from the second discharge outlet group.

When one discharge outlet group is constituted by a plurality of discharge outlets N, the supply positions of the imprint material R on the substrate which exist in a range 2015 indicate the positions to which the imprint material R is supplied from the first discharge outlet N of the first discharge outlet group. The supply positions of the imprint material R on the substrate which exist in a range 2016 indicate the positions to which the imprint material R is supplied from the second discharge outlet N of the second discharge outlet group.

When the imprint material R is supplied from the supply unit D at a predetermined timing while the substrate stage 102 is moved, the supply positions of the imprint material R which exist on a line 2017 indicate the positions to which the imprint material R is supplied at the same timing. Likewise, the supply positions of the imprint material R which exist on lines 2018 to 2026 indicate the positions to which the imprint material R is supplied at the same timing. The maps RP and RPM can be displayed in the map display area 401 of the editing screen DAE so as to make the supply conditions for the imprint material R identifiable regarding the supply positions of the imprint material R on the substrate.

Figure 19:
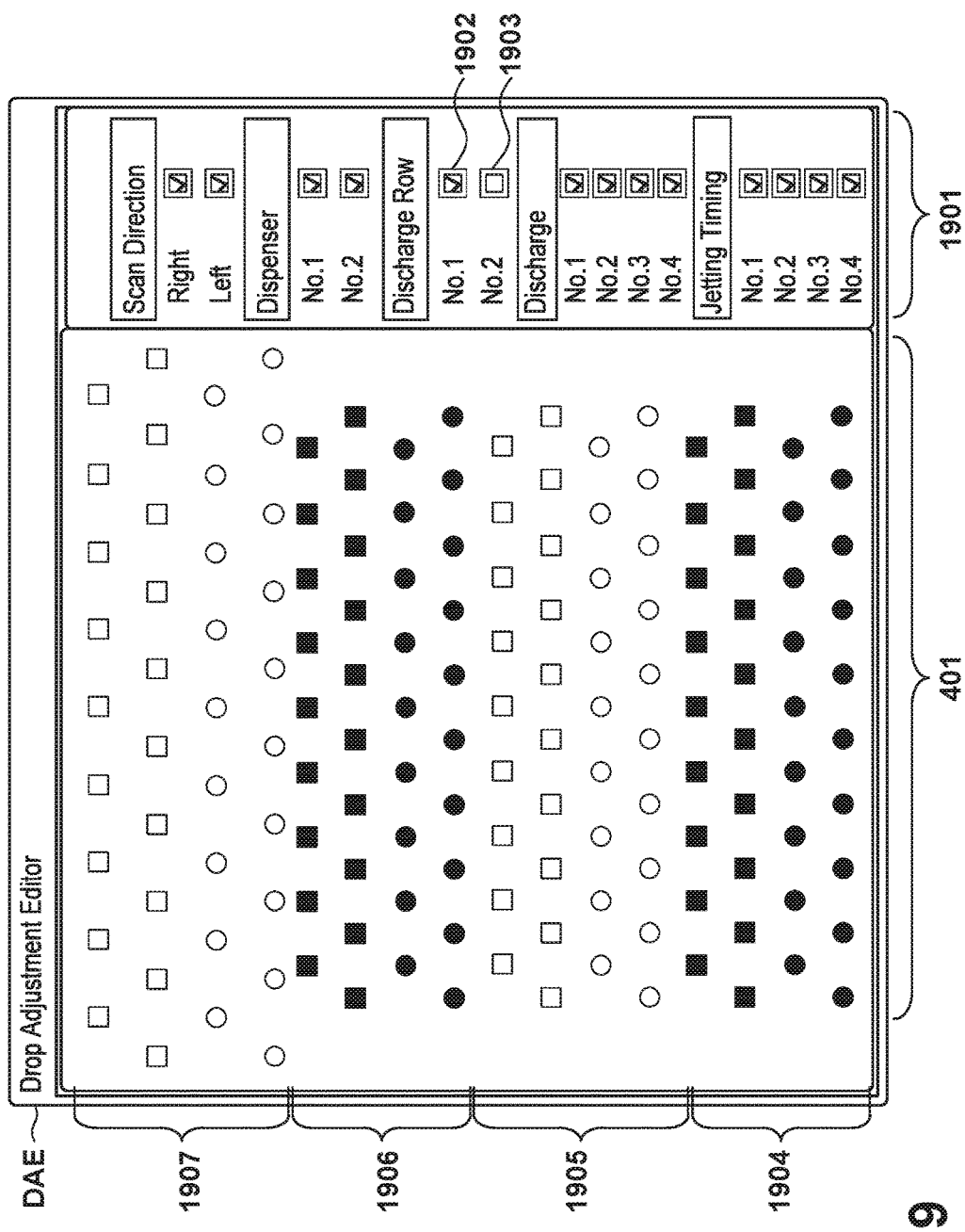
FIG. 19 is a view showing an example of a map displayed on the editing screen.

FIG. 19 is a view showing an example of the map RP (or RPM) displayed in the map display area 401 of the editing screen DAE. As shown in FIG. 19, the supply conditions for the imprint material R are displayed in a supply condition display area 1901 of the editing screen DAE. When, for example, the supply unit D is constituted by two rows of discharge outlet groups, a supply condition 1902 indicating the supply of the imprint material R from the first row of discharge outlets is displayed in the supply condition display area 1901. A supply condition 1903 indicating the supply of the imprint material R from the second row of discharge outlets is displayed in the supply condition display area 1901.

The supply conditions 1902 and 1903 respectively include checkboxes. The information to be displayed in the map display area 401 is switched in accordance with the contents of the checkboxes. Referring to FIG. 19, the checkbox corresponding to the supply condition 1902 is validated. The map display area 401, therefore, identifiably displays information indicating that the supply positions of the imprint material R existing in ranges 1904 and 1906 indicate the positions to which the imprint material R is supplied from the first row of discharge outlets. In addition, referring to FIG. 19, the checkbox of the supply condition 1903 is invalidated. Consequently, the supply positions of the imprint material R existing in ranges 1905 and 1907 are not displayed in the map display area 401 because the imprint material R is supplied from the second row of discharge outlets. Referring to FIG. 19, however, the broken lines indicate that such information is not displayed in the map display area 401.

A supply condition for the imprint material R has been described with reference to FIG. 19 by taking one discharge outlet group as an example. Note however that other supply conditions (for example, a scan direction and the timing of jetting the imprint material R from each dispenser or each discharge outlet) for the imprint material R may be handled in the same manner as described above by reflecting the information displayed in the map display area 401 in accordance with the contents of the checkbox.

As described above, the supply positions of the imprint material R respectively indicated in the maps RP and RPM may be displayed in the map display area 401 of the editing screen DAE so as to make specific discharge outlets identifiable, among the plurality of discharge outlets N, from which the imprint material R is to be supplied. Likewise, the supply positions of the imprint material R respectively indicated in the maps RP and RPM may be displayed in the map display area 401 of the editing screen DAE so as to make a specific dispenser identifiable, among the plurality of dispensers, from which the imprint material R is to be supplied. This makes it possible to efficiently determine the maps RP and RPM and the values of the apparatus parameters MP. When, for example, a scan pass offset is to be adjusted as one of the apparatus parameters MP, displaying only the supply positions of the imprint material R supplied along a backward path allows the user to check only the supply positions of the imprint material R which are changed by adjusting the value of the apparatus parameter MP.

Figure 20:
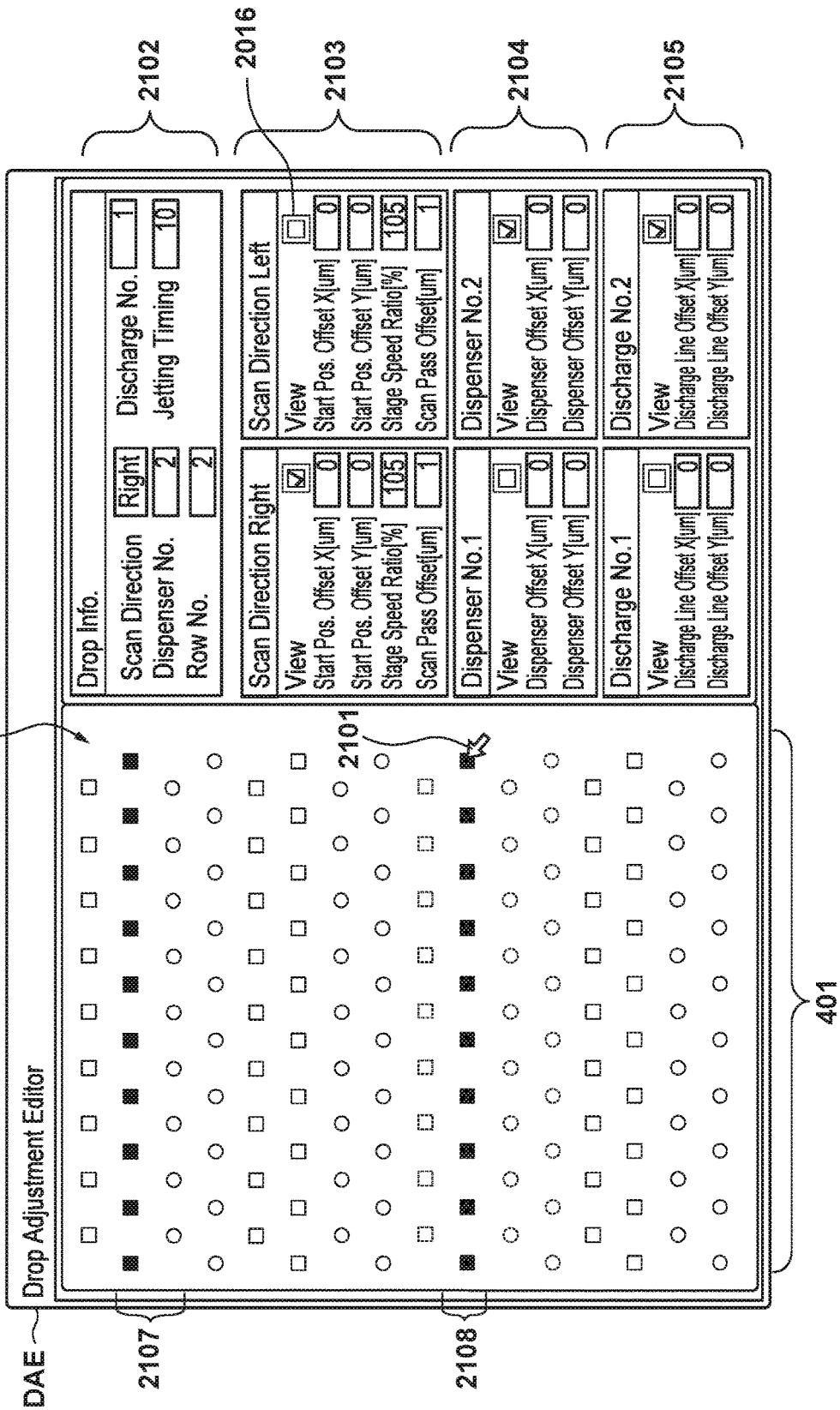
FIG. 20 is a view showing an example of a map displayed on the editing screen.

FIG. 20 is a view showing an example of the map RP (or RPM) displayed in the map display area 401 of the editing screen DAE. For example, as shown in FIG. 20, the user selects any one of the supply positions of the imprint material R by moving an icon 2101 displayed on the monitor 111 in the map display area 401 using the input device 112. With this operation, supply conditions regarding the selected supply position of the imprint material R are displayed in a display area 2102. For example, this indicates that the selected supply position of the imprint material R selected by the icon 2101 corresponds to a forward path of the substrate stage 102, the dispenser on the second row, the discharge outlet group on the second row, the first discharge outlet of the discharge outlet group, and the 10th jetting timing of the imprint material R.

In addition, when adjusting the value of one of the apparatus parameters MP, the editing screen DAE allows the user to determine the apparatus parameter MP while grasping the supply positions of the imprint material R which are influenced by the apparatus parameter MP. The editing screen DAE includes an adjustment window 2103 for adjusting the values of the apparatus parameters MP associated with the scan directions, an adjustment window 2104 for adjusting the values of the apparatus parameters MP associated with the dispensers, and an adjustment window 2105 for adjusting the values of the apparatus parameters MP associated with the discharge outlet groups. These adjustment windows each include, for each supply condition for the imprint material R, a display switching parameter 2016 for switching whether to display the corresponding supply positions of the imprint material R in the map display area 401. Depending on whether the display switching parameter 2016 is validated or invalidated, the corresponding supply positions of the imprint material R are identifiably displayed in the map display area 401. When, for example, the display switching parameter 2016 is validated, the corresponding supply positions of the imprint material R are displayed in solid lines, whereas when the display switching parameter 2016 is invalidated, the corresponding supply positions of the imprint material R are displayed in broken lines.

Referring to FIG. 20, the display switching parameters 2016 are set in accordance with the supply conditions for the imprint material R displayed in the display area 2102. For example, in the adjustment window 2103, the display switching parameter concerning the forward path is validated. In the adjustment window 2104, the display switching parameter concerning the dispenser on the second row is validated. In the adjustment window 2105, the display switching parameter concerning the discharge outlet group on the second row is validated. Accordingly, only the supply positions of the imprint material R which exist in ranges 2108 and 2107 are displayed in solid line in correspondence with the display switching parameters 2016 in the map display area 401.

In this manner, the user can grasp supply conditions for the supply position of the imprint material R of interest in the display area 2102, and can switch the contents of each display switching parameter 2016 and the corresponding information to be displayed in the map display area 401. This allows the user to easily grasp supply conditions regarding the supply position of the imprint material R of interest and the influence of the apparatus parameters MP for each supply condition, thereby efficiently determining the apparatus parameters MP.

In addition, this embodiment has exemplified the manner of switching information to be displayed in accordance with each checkbox as a method of displaying supply conditions regarding each supply position of the imprint material R. However, there is also available a method of directly displaying supply conditions regarding each supply position of the imprint material R in the map display area 401. That is, the display method is not limited to switching information to be displayed in accordance with each checkbox.

The pattern of a cured material which is formed by the imprint apparatus 100 is permanently used for at least part of various types of articles or temporarily used for the manufacture of various types of articles. Articles include electric circuit elements, optical elements, MEMSs, recording elements, sensors, and molds. Electric circuit elements include volatile and nonvolatile semiconductor memories such as a DRAM, SRAM, flash memory, and MRAM and semiconductor elements such as an LSI, CCD, image sensor, and FPGA. Molds include molds for imprinting.

The pattern of a cured material is used directly as at least a constituent member of the above article or temporarily used as a resist mask. After etching or ion implantation in a working process for a substrate, the resist mask is removed.

Figure 21A:
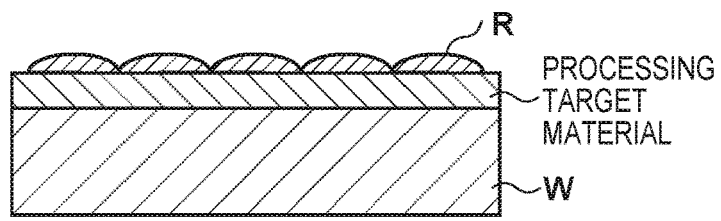
FIGS. 21A to 21F are sectional views for explaining a method of manufacturing an article.

A concrete method of manufacturing an article will be described next. As shown in FIG. 21A, the substrate W such as a silicon wafer having a workpiece material such as an insulator formed on its surface is prepared. Subsequently, the imprint material R is applied to the surface of the workpiece material by an inkjet method or the like. FIG. 21A shows how the imprint material R in the form of a plurality of droplets is applied onto the substrate.

Figure 21B:
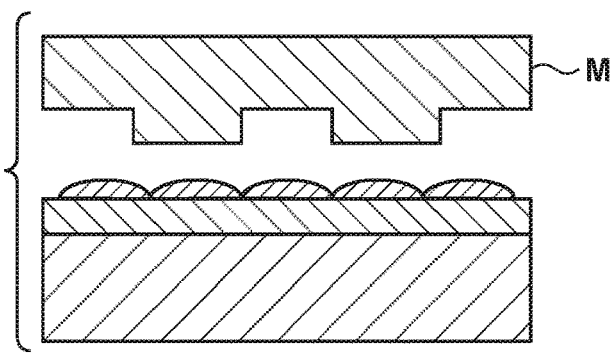
Figure 21C:
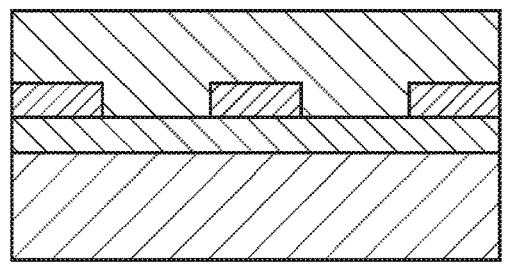

As shown in FIG. 21B, the mold M for imprinting is set such that the side on which a concave-convex pattern is formed faces the imprint material R on the substrate. As shown in FIG. 21C, the substrate W coated with the imprint material R and the mold M are brought into contact with each other, and a pressure is applied to them. The imprint material R fills the gap between the mold M and the workpiece material. Irradiating the resultant structure with light as curing energy through the mold M in this state will cure the imprint material R.

Figure 21D:
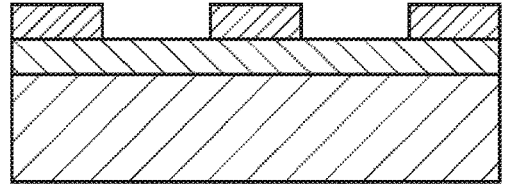

As shown in FIG. 21D, after the imprint material R is cured, the mold M and the substrate W are separated from each other, thereby forming the pattern of the cured material of the imprint material R on the substrate. The convex portions of the pattern of this cured material correspond to the concave portions of the mold M, and the convex portions of the mold M correspond to the concave portions of the cured material. That is, the concave-convex pattern of the mold M is transferred onto the imprint material R.

Figure 21E:
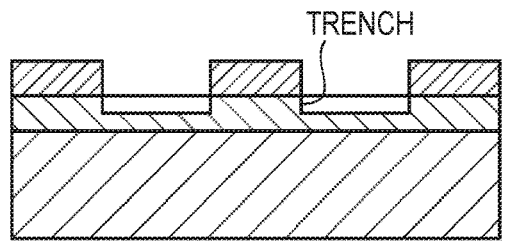
Figure 21F:
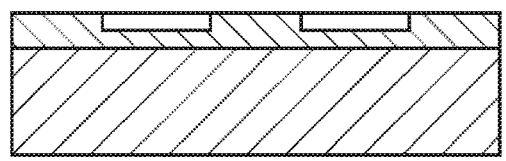

As shown in FIG. 21E, etching using the pattern of the cured material as an etching resistant mask will remove those portions of the surface of the workpiece material on which no cured material is present or thin remaining portions of the cured material are left, thereby forming grooves. As shown in FIG. 21F, removing the pattern of the cured material can obtain an article with grooves being formed in the surface of the workpiece material. In this case, the pattern of the cured material is removed. However, configuration may be taken such that the pattern is not removed after the process and is used as a film as a dielectric interlayer included in a semiconductor element or the like, that is, a constituent member of an article.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

Note that one aspect of the present invention also includes a method of supporting editing of a map indicating the supply positions of an imprint material to be supplied onto a substrate by generating the above editing screen (interface) and providing the editing screen to the user.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imprint apparatus which forms a pattern of an imprint material onto a substrate by using a mold, the apparatus comprising
a control unit configured to provide a user interface for displaying a first map indicating a supply position of the imprint material to be supplied onto the substrate, an adjustment window for adjusting a value of an apparatus parameter which is set in the imprint apparatus and used to change a supply position of the imprint material, and a second map indicating a supply position of the imprint material after adjustment of the value of the apparatus parameter.

2. The apparatus according to claim 1, wherein the control unit includes a first display unit configured to display the first map and the second map on the user interface, and
a second display unit configured to display the adjustment window on the user interface.

3. The apparatus according to claim 2, wherein the first display unit superimposes and displays the first map and the second map on the user interface.

4. The apparatus according to claim 1, further comprising an input unit configured to make a user input the value of the apparatus parameter via the user interface.

5. The apparatus according to claim 1, wherein the control unit displays the first map so as to allow a user to change a supply position of the imprint material indicated in the first map via the user interface.

6. The apparatus according to claim 5, wherein when a supply position of the imprint material indicated in the first map is changed, the control unit obtains a value of the apparatus parameter required to supply the imprint material to a supply position after the change, and displays the value of the apparatus parameter in the adjustment window.

7. The apparatus according to claim 1, wherein the control unit superimposes and displays at least part of a pattern of the mold, the first map, and the second map on the user interface.

8. The apparatus according to claim 7, wherein at least part of a pattern of the mold includes at least one of a circuit pattern to be formed on the substrate, a mark pattern used for alignment of the mold, and a boundary portion between the circuit pattern and the mark pattern.

9. The apparatus according to claim 1, wherein the control unit superimposes and displays a region, on the substrate, to which supply of the imprint material is inhibited, the first map, and the second map on the user interface.

10. The apparatus according to claim 1, wherein the control unit superimposes and displays a grid defining a position on the substrate to which the imprint material is configured to be supplied, the first map, and the second map on the user interface.

11. The apparatus according to claim 1, further comprising a supply unit including a plurality of discharge outlets for discharging the imprint material onto the substrate and configured to supply the imprint material onto the substrate,
wherein the control unit displays supply positions of the imprint material indicated in the first map and the second map on the user interface such that each specific discharge outlet, of the plurality of discharge outlets, from which the imprint material is supplied is identifiable.

12. The apparatus according to claim 11,
wherein the supply unit includes a plurality of dispensers respectively including the plurality of discharge outlets,
wherein the control unit displays supply positions of the imprint material indicated in the first map and the second map on the interface such that each dispenser, of the plurality of dispensers, from which the imprint material is supplied is identifiable.

13. The apparatus according to claim 1, further comprising a plurality of dispensers configured to supply the imprint material onto the substrate,
wherein the control unit displays supply positions of the imprint material indicated in the first map and the second map on the interface such that each dispenser, of the plurality of dispensers, from which the imprint material is supplied is identifiable.

14. The apparatus according to claim 1, wherein the apparatus parameter includes at least one of a position at which supply of the imprint material starts in a shot region on the substrate, a speed of a substrate stage which holds the substrate when the imprint material is supplied onto the substrate, an interval between a forward path and a backward path of the substrate stage when the imprint material is supplied onto the substrate, an interval between a plurality of dispensers which supply the imprint material onto the substrate, an interval between a plurality of discharge outlets which jet the imprint material onto the substrate, and a timing of supplying the imprint material onto the substrate.

15. A method of manufacturing an article, the method comprising:
forming a pattern on a substrate by using an imprint apparatus;
processing the substrate on which the pattern is formed in the forming; and
manufacturing an article from the processed substrate,
wherein the imprint apparatus forms a pattern of an imprint material on the substrate by using a mold and includes a control unit configured to provide a user interface for displaying a first map indicating a supply position of the imprint material to be supplied onto the substrate, an adjustment window for adjusting a value of an apparatus parameter which is set in the imprint apparatus and used to change a supply position of the imprint material, and a second map indicating a supply position of the imprint material after adjustment of the value of the apparatus parameter.

16. An information processing apparatus which generates a user interface provided for an imprint apparatus for forming a pattern of an imprint material onto a substrate by using a mold, the apparatus comprising
a control unit configured to provide a user interface for displaying a first map indicating a supply position of the imprint material to be supplied onto the substrate, an adjustment window for adjusting a value of an apparatus parameter which is set in the imprint apparatus and used to change a supply position of the imprint material, and a second map indicating a supply position of the imprint material after the change of the value of the apparatus parameter.

17. A method which is used for an imprint apparatus for forming a pattern of an imprint material onto a substrate by using a mold and supports editing of a map indicating a supply position of the imprint material to be supplied onto the substrate, the method comprising:

generating a user interface for displaying a first map indicating a supply position of the imprint material to be supplied onto the substrate, an adjustment window for adjusting a value of an apparatus parameter which is set in the imprint apparatus and used to change a supply position of the imprint material, and a second map indicating a supply position of the imprint material after the change of the value of the apparatus parameter; and a second step of providing the user interface generated in the generating.

18. A storage medium storing a program for causing an information processing apparatus to execute a method which is used for an imprint apparatus for forming a pattern of an imprint material onto a substrate by using a mold and supports editing of a map indicating a supply position of the imprint material to be supplied onto the substrate, the method comprising:

generating a user interface for displaying a first map indicating a supply position of the imprint material to be supplied onto the substrate, an adjustment window for adjusting a value of an apparatus parameter which is set in the imprint apparatus and used to change a supply position of the imprint material, and a second map indicating a supply position of the imprint material after the change of the value of the apparatus parameter; and a second step of providing the user interface generated in the generating.

* * * * *